(12) United States Patent
Lee et al.

(10) Patent No.: US 12,419,153 B2
(45) Date of Patent: Sep. 16, 2025

(54) SOLAR CELL AND METHOD FOR MANUFACTURING THE SAME

(71) Applicant: JINGAO SOLAR CO., LTD., Hebei (CN)

(72) Inventors: Kyoungsoo Lee, Seoul (KR); Goohwan Shim, Seoul (KR); Ilhyoung Jung, Seoul (KR)

(73) Assignee: JINGAO SOLAR CO., LTD., Xingtai (CN)

( * ) Notice: Subject to any disclaimer, the term of this patent is extended or adjusted under 35 U.S.C. 154(b) by 0 days.

(21) Appl. No.: 18/360,776

(22) Filed: Jul. 27, 2023

(65) Prior Publication Data

US 2023/0371291 A1    Nov. 16, 2023

Related U.S. Application Data

(63) Continuation of application No. PCT/KR2022/000967, filed on Jan. 19, 2022.

(30) Foreign Application Priority Data

Jan. 29, 2021 (KR) .................. 10-2021-0013408

(51) Int. Cl.
*H10K 30/40* (2023.01)
*H10F 71/00* (2025.01)
*H10K 71/12* (2023.01)

(52) U.S. Cl.
CPC ............. *H10K 30/40* (2023.02); *H10F 71/00* (2025.01); *H10K 71/12* (2023.02)

(58) Field of Classification Search
CPC ........ H10K 30/00–89; H10K 39/00–18; H10F 10/00–19; H10F 19/00–908; H10F 71/00–1395; H10F 77/00–1699
See application file for complete search history.

(56) References Cited

U.S. PATENT DOCUMENTS

2017/0338045 A1* 11/2017 Vak ............... H10K 30/152
2018/0247769 A1* 8/2018 Qi ................ H10K 85/50
(Continued)

FOREIGN PATENT DOCUMENTS

CN     107331777 A  * 11/2017
CN     109980093 A  *  7/2019
(Continued)

OTHER PUBLICATIONS

CN-109980093-A English (Year: 2019).*
(Continued)

*Primary Examiner* — Bach T Dinh
(74) *Attorney, Agent, or Firm* — Wiersch Law Group

(57) ABSTRACT

A method for manufacturing a solar cell includes: forming a first photoelectric conversion part including a photoelectric conversion layer including a perovskite compound, a first transport layer, and a second transport layer; and forming a first electrode electrically connected to the first photoelectric conversion part and forming a second electrode electrically connected to the first photoelectric conversion part. The formation of the first photoelectric conversion part includes: forming a first film using a first material constituting the perovskite compound; spraying a second material constituting the perovskite compound on the first film to form a second film; performing a first heat treatment to diffuse the first film and the second film to form the perovskite compound; and performing washing to remove the residual second film residual on the perovskite compound.

13 Claims, 10 Drawing Sheets

(56) References Cited

U.S. PATENT DOCUMENTS

| | | | |
|---|---|---|---|
| 2018/0358182 A1 | 12/2018 | Fleischer et al. | |
| 2020/0212243 A1 | 7/2020 | Kim et al. | |
| 2022/0093345 A1* | 3/2022 | Iannelli | H10K 30/88 |
| 2023/0110770 A1* | 4/2023 | Huang | H10K 85/141 |
| | | | 438/57 |

FOREIGN PATENT DOCUMENTS

| | | | |
|---|---|---|---|
| CN | 112201673 A | 1/2021 | |
| EP | 3754729 A1 | 12/2020 | |
| JP | 2017079334 A | 4/2017 | |
| KR | 20110042111 A | 4/2011 | |
| KR | 20180099577 A | 9/2018 | |
| KR | 20180130397 A | 12/2018 | |
| KR | 20200036780 A | 4/2020 | |
| WO | 2010029751 A1 | 3/2010 | |

OTHER PUBLICATIONS

CN-107331777-A English (Year: 2017).*
Japanese Grant of Patent for Application No. 2023-545774, mailed Dec. 17, 2024 (5 pages).
International Search Report (PCT/KR2022/000967); Date of Mailing: May 3, 2022.
Two-step-ultrasonic-spray-deposition-of-CH3NH3Pbl3-for-efficient-and-large-area-perovskitesolar-cell.
Japanese Office Action for Application No. 2023-545774, mailed Sep. 10, 2024 (6 pages).
Korean Office Action for Application No. 10-2021-0013408, mailed Oct. 15, 2024 (21 pages).
Huang, the Haibo, and et al. "Two-step ultrasonic spray deposition of CH3NH3Pbl3 for efficient and large-area perovskite solar cell." Nano Energy 27 (2016):352-358(Jul. 25, 2016) (7 pages).

* cited by examiner (a)

(b)

(a)

(b)

SOLAR CELL AND METHOD FOR MANUFACTURING THE SAME

CROSS-REFERENCE TO RELATED APPLICATIONS

This is a continuation of International Application No. PCT/KR2022/000967, filed on Jan. 19, 2022, which claims priority to Korean Patent Application No. 10-2021-0013408 filed in the Republic of Korea on Jan. 29, 2021, both of which are hereby expressly incorporated by reference into the present application.

TECHNICAL FIELD

The present disclosure relates to a solar cell and a method for manufacturing a solar cell, and more particularly, to a solar cell including a perovskite structure and a method for manufacturing a solar cell.

BACKGROUND

A solar cell including a semiconductor substrate has excellent photoelectric conversion efficiency and thus is widely used. However, there are certain limitations in improving the photoelectric conversion efficiency of the solar cell including the semiconductor substrate, so solar cells having a variety of structures have been proposed.

As an example, proposed is a solar cell including a perovskite compound that absorbs short-wavelength light to perform photoelectric conversion using a short-wavelength light. However, when a photoelectric conversion layer is formed by such perovskite compound, organic material and inorganic material are chemically combined to form a single perovskite compound layer.

In order to form the perovskite compound layer as described above, in Korean Patent Publication No. 10-2018-0099577 (published on Sep. 5, 2018), a method of preparing a perovskite solution by mixing organic material and inorganic material, and then coating a substrate with the perovskite solution to form the perovskite compound layer is disclosed.

As described above, in the case of forming the perovskite compound layer into a single layer, there is a disadvantage that it is not easy to control different film thicknesses under viscosity and processing conditions of the solution.

In Korean Patent Publication No. 10-2018-01303977 (published on Dec. 7, 2018), a method of manufacturing the perovskite compound layer is proposed. In this method, molecules for forming the perovskite compound sequentially formed in two steps one by one, and then thermal treatment is performed to diffuse the two material layers to form the perovskite compound layer.

The formation of the two steps as described above is applicable to a variety of stacking manners in various steps.

As an example, in the case of formation in a variety of wet or dry manners, the formation may be performed in a wet manner such as spin coating, dip coating, blade coating, or spraying.

When spin coating is applied, a film with a uniform thickness may be formed, and a low-viscosity solution is applicable, but there is a disadvantage that it is difficult to coat a large area.

When dip coating, blade coating, or spraying is applied, large-area coating can be performed, but there is a disadvantage that it is difficult to control a film thickness according to the viscosity of the solution and the process conditions.

Korean Patent Publication No. 10-2018-1303977 discloses that an inorganic material layer is formed by sputtering and an organic material layer is formed with various methods such as coating or thermal deposition and sputtering. However, in the case of forming the organic material layer on the inorganic material layer by coating, it is difficult to control a thickness of the coated organic material layer, so it is difficult to control a thickness of an entire material layer.

PRIOR ART REFERENCES

Patent References

Korean Patent Publication No. 10-2018-0099577 (published on Sep. 5, 2018)
Korean Patent Publication No. 10-2018-1303977 (published on, Dec. 7, 2018)

SUMMARY

The present disclosure provides a method for manufacturing a solar cell and a solar cell with excellent efficiency and reliability. In particular, the present disclosure aims to provide a solar cell including a perovskite photovoltaic layer applicable to a large-size solar cell.

In addition, the present disclosure provides a solar cell and a method for manufacturing a solar cell in which a photoelectric conversion part including a perovskite compound has a desired thickness so that composition of the perovskite compound can be maintained uniformly in a length direction with improving photoelectric efficiency.

Moreover, the present disclosure provides a solar cell and a method for manufacturing a solar cell having excellent efficiency and reliability. The solar cell includes a tandem structure. In addition to the photoelectric conversion part including the perovskite compound, the tandem structure further includes another photoelectric conversion part having a different material or structure.

The solar cell according to embodiments of the present disclosure includes a first photoelectric conversion part, a second photoelectric conversion part, a first electrode, and a second electrode. The first photoelectric conversion part includes a photoelectric conversion layer including a perovskite compound, a first transport layer on one side of the photoelectric conversion layer, and a second transport layer on the other side of the photoelectric conversion layer. The second photoelectric conversion part is located below the second transport layer of the first photoelectric conversion part and has a different material or structure from that of the first photoelectric conversion part. The first electrode is electrically connected to the first photoelectric conversion part on one surface of the first photoelectric conversion part, where the one surface is a light-receiving surface, and the second electrode is electrically connected to a bottom of the second photoelectric conversion part. A surface of the first photoelectric conversion part includes at least one droplet mark.

The photoelectric conversion layer may have a thickness greater than a first thickness.

The first thickness may range from 200 nm to 1 µm.

The photoelectric conversion layer may have a uniform composition in a stacking direction.

A length of one surface of the first photoelectric conversion part may range from 12 cm to 17 cm.

In addition, a method for manufacturing a solar cell in the present disclosure includes the following steps: a step of forming a first photoelectric conversion part including a photoelectric conversion layer including a perovskite compound, a first transport layer on one side of the photoelectric conversion layer, and a second transport layer on the other side of the photoelectric conversion layer, and an electrode formation step of forming a first electrode electrically connected to the first photoelectric conversion part on one side of the first photoelectric conversion part and forming a second electrode electrically connected to the first photoelectric conversion part on the other side of the first photoelectric conversion part. The step of forming the first photoelectric conversion part includes: a step of forming a first film from a first material constituting the perovskite compound; a step of spraying a second material constituting the perovskite compound on the first film to form a second film; a step of performing first heat treatment to diffuse the first film and the second film to form the perovskite compound; and a step of performing washing to remove a portion of the second film remaining on the perovskite compound.

In the step of forming the first film, the first material may be vacuum deposited to form the first film.

The step of forming the second film may include: a step of using a third material as a solvent to dissolve the second material to prepare a spray solution; and a step of spraying the spray solution onto the first film to form the second film.

The first film may be coated with the spray solution at least more than once.

The third material may be an alcoholic solvent having a viscosity below a predetermined viscosity at room temperature.

The third material may be included in a detergent that removes the second material in the step of washing the second film.

The method may further include a step of performing a second heat treatment on the photoelectric conversion layer after the washing for removing a portion of the second film.

The second heat treatment may be performed at a same temperature and within a same time length as the first heat treatment.

In the formation of the second film, a droplet mark may be formed on a surface of a substrate by spraying, and an uneven structure is formed at a boundary of the droplet mark.

In the washing step, a height of the uneven structure may be reduced at the boundary of the droplet mark.

A diameter of the droplet mark may range from 0.1 μm to 1000 μm.

The second film may be excessively formed such that a sum of a thickness of the second film and a thickness of the first film is greater than a thickness of the photoelectric conversion layer.

The first film may have a thickness 0.3 to 0.8 times of a thickness of the photoelectric conversion layer.

Prior to the step of forming the first photoelectric conversion part, the method may further include: forming a second photoelectric conversion part having a different material or structure from the first photoelectric conversion part.

The forming the second photoelectric conversion part may include: forming, on a semiconductor substrate, a first conductive region composed of a first semiconductor layer formed separately with respect to the semiconductor substrate and a second conductive region composed of the first semiconductor layer formed separately with respect to the semiconductor substrate.

The method may further include: forming a junction layer on the second photoelectric conversion part. In the step of forming the first photoelectric conversion part, the second transport layer is formed on the junction layer, the photoelectric conversion layer is formed on the second transport layer, and the first transport layer is formed on the photoelectric conversion layer.

DESCRIPTION OF EMBODIMENTS

Figure 1:
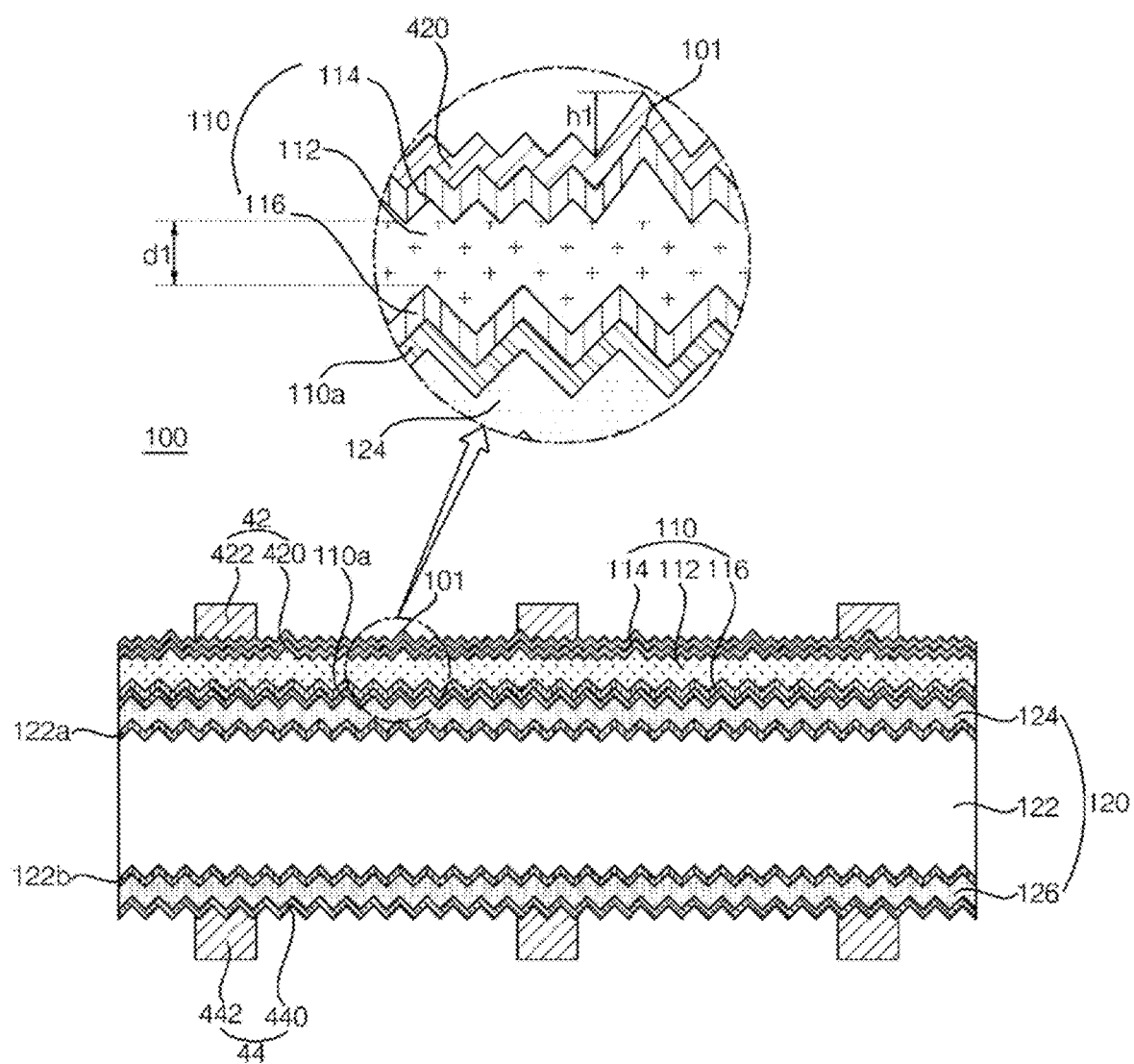
FIG. 1 is a sectional view of a solar cell according to some embodiments of the present disclosure.

Embodiments of the present disclosure will be described in detail below with reference to the accompanying drawings. However, the present disclosure is not limited to such embodiments, and may be modified into various forms.

In the drawings, in order to clearly and briefly describe the present disclosure, the illustration of parts irrelevant to the description is omitted, and the same reference numerals are used for the same or extremely similar parts throughout the specification. In addition, in the drawings, a thickness, a width, etc., are enlarged or reduced in order to make the description more clear, and the thickness, the width, or the like of the present disclosure are not limited to those illustrated in the drawings.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

A solar cell and a method for manufacturing a solar cell according to some embodiments of the present disclosure will be described in detail below with reference to the accompanying drawings.

Figure 2:
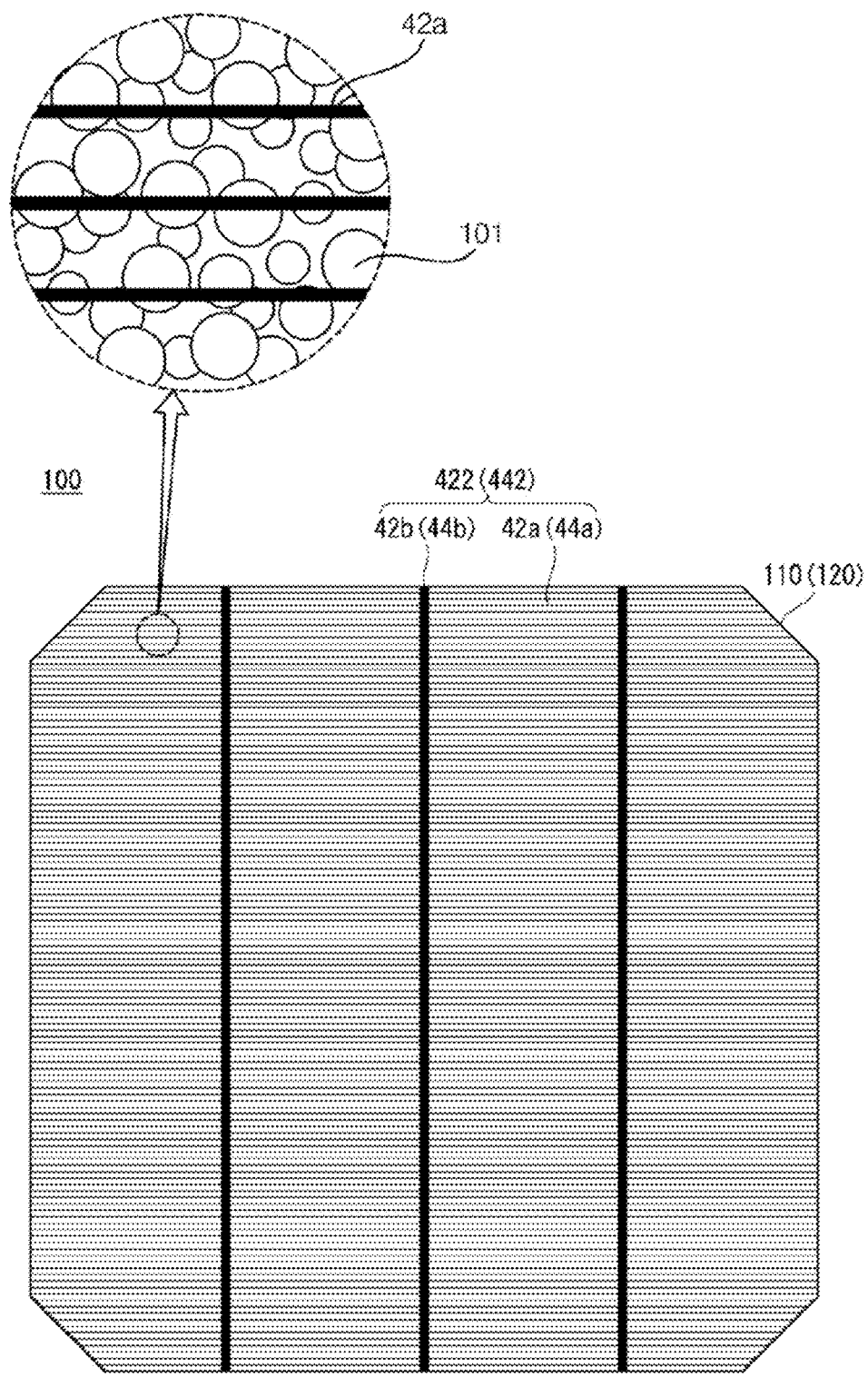
FIG. 2 is a plan view of a second electrode layer of the solar cell shown in FIG. 1.

FIG. 1 is a sectional view of a solar cell according to some embodiments of the present disclosure, and FIG. 2 is a plan view of a second electrode layer of the solar cell shown in FIG. 1.

Referring to FIG. 1, a solar cell 100 according to this embodiment may include a first photoelectric conversion part 110, and the first photoelectric conversion part 110 may include a photoelectric conversion layer 112 including a perovskite compound, and a first electrode 42 and a second electrode 44 electrically connected to the photoelectric conversion layer 112. Herein, the photoelectric conversion layer 112 including the perovskite compound may be formed into a thick film having a thickness greater than a predetermined thickness, and may be formed to have a uniform composition in a stacking direction. In addition, the solar cell 100 according to this embodiment may be a tandem structure further including a second photoelectric conversion part 120 having a material or structure different from that of the first photoelectric conversion part 110. In addition, the solar cell 100 according to this embodiment serves as a large-area solar cell, and when the solar cell has a quadrilateral shape, a large-area perovskite solar cell 100 with a length ranging from 10 cm to 20 cm may be formed. In some embodiments, the length of the large-area perovskite solar cell 100 ranges from 12 cm to 17 cm. This is a solar cell manufactured from an ingot when a diameter of the ingot ranges from 18 cm to 25 cm, and the solar cell may have various shapes within the diameter of the ingot.

A more detailed description will be provided.

In the solar cell 100 according to this embodiment, the second photoelectric conversion part 120 may have a pn junction structure including a semiconductor substrate 122. As an example, the second photoelectric conversion part 120 may include a semiconductor substrate 122, and conductive regions 124 and 126 formed in the semiconductor substrate 122 or on the semiconductor substrate 122. The conductive regions 124 and 126 may include a first conductive region 124 having a first conductivity type and a second conductive region 126 having a second conductivity type.

The semiconductor substrate 122 may be composed of a crystalline semiconductor (e.g., single crystal or polycrystalline semiconductor, for example, single crystal or polycrystalline silicon) containing a single semiconductor material (e.g., a Group IV element). Then, since the second photovoltaic part 120 is based on the semiconductor substrate 122 with high crystallinity and fewer defects, the second photovoltaic part 120 may have excellent electrical characteristics. As an example, the second photoelectric conversion part 120 may have a crystalline silicon solar cell structure.

A front surface and/or a back surface of the semiconductor substrate 122 may be textured to have an uneven structure. The uneven structure may have, for example, a pyramid shape in which a surface constituting the outer surface of the semiconductor substrate 122 is configured as a (111) surface of the semiconductor substrate 122 and has an irregular size. Thereby, when surface roughness is relatively large, reflectance of light may be lowered. However, the present disclosure is not limited thereto.

In this embodiment, the semiconductor substrate 122 may be configured to include a base region having a first or second conductivity type by being doped with a first or second conductive dopant having a doping concentration lower than that of the first or second semiconductor layers 124 and 126. That is, the semiconductor substrate 122 may include only the base region without a doping region formed by additionally doping the base region with a dopant.

A first passivation film 122a is formed on the front surface of the semiconductor substrate 122, and a second passivation film 122b is formed on the back surface of the semiconductor substrate 122.

The first passivation film 122a and the second passivation film 122b may act as a barrier for electrons and holes so as not to allow minority carriers to pass. After accumulation in a portion adjacent to the first passivation film 122a and the second passivation film 122b, only majority carriers with energy above a predetermined amount pass through the first passivation film 122a and the second passivation film 122b. As an example, the first passivation film 122a and the second passivation film 122b may be a tunneling film. In this case, the majority carriers with energy above the predetermined amount can easily pass through the first passivation film 122a and the second passivation film 122b due to a tunneling effect.

The first passivation film 122a or the second passivation film 122b may include various materials that allow carriers to tunnel, and as an example, may include nitrides, semiconductors, conductive polymers, and the like. For example, the first passivation film 122a or the second passivation film 122b may include silicon oxide, silicon nitride, silicon oxynitride, an intrinsic amorphous semiconductor (intrinsic amorphous silicon as an example), an intrinsic polycrystalline semiconductor (intrinsic polysilicon as an example), and the like. In this case, the first passivation film 122a and the second passivation film 122b may include an intrinsic amorphous semiconductor. As an example, the first passivation film 122a and the second passivation film 122b may be formed into an amorphous silicon (a-Si) layer, an amorphous silicon carbide (a-SiC$_x$) layer, an amorphous silicon oxide (a-SiO$_x$) layer, or the like. Then, since the first passivation film 122a and the second passivation film 122b have similar properties to the semiconductor substrate 122, surface properties of the semiconductor substrate 122 can be more effectively improved.

In this case, the first passivation film 122a and the second passivation film 122b may be entirely formed on the front surface and the back surface of the semiconductor substrate 122, respectively. Therefore, the front surface and the back surface of the semiconductor substrate 122 can be entirely passivated, and can be easily formed without additional patterning. Thicknesses of the passivation films 122a and 122b may be less than those of the conductive regions 124 and 126 (below 5 nm as an example) to sufficiently achieve the tunneling effect. However, the present disclosure is not limited thereto, and the passivation films 122a and 122b may have a variety of materials, shapes, thicknesses, and the like.

The first conductive region 124 having the first conductivity type may be formed (e.g. in contact with) on the first passivation film 122a. In addition, the second conductive region 126 having the second conductivity type opposite to the first conductivity type may be positioned (e.g. in contact with) on the second passivation film 122b.

The first conductive region 124 may be a region including a first-conductivity-type dopant and having the first conductivity type. In addition, the second conductive region 126 may be a region including a second-conductivity-type dopant and having the second conductivity type.

The first conductive region 124 and the second conductive region 126 may respectively include a same semiconductor material as the semiconductor substrate 122 (in some embodiments, a single semiconductor material, e.g., silicon). As an example, the first conductive region 124 and the second conductive region 126 may be formed into an amorphous silicon (a-Si) layer, an amorphous silicon carbide (a-SiC$_x$) layer, an amorphous silicon oxide (a-SiO$_x$) layer, or the like. Then, differences in properties that may occur when the first conductive region 124 and the second conductive region 126 have similar properties to the semiconductor substrate 122 but include semiconductor materials different from each other can be minimized. However, the first conductive region 124 and the second conductive region 126, which are separately formed on the semiconductor substrate 122 with respect to the semiconductor substrate 122, may have a crystal structure different from that of the semiconductor substrate 122 so as to be easily formed on the semiconductor substrate 122.

For example, each of the first conductive region 124 and the second conductive region 126 may be formed by doping the first-conductivity-type dopant or second-conductivity-type dopant into an amorphous semiconductor or the like that can be easily manufactured with various methods such as deposition. Then, the first conductive region 124 and the second conductive region 126 may be easily formed through a simple process. In this case, the first passivation film 122*a* and the second passivation film 122*b*, when composed of an intrinsic amorphous semiconductor (intrinsic amorphous silicon as an example), may have excellent adhesive properties, excellent electrical conductivity, and the like.

In this embodiment, when the semiconductor substrate 122 (or the base region) has the first conductivity type, the second conductive region 126 may constitute an emitter region forming a pn junction with the semiconductor substrate 122. The first conductive region 124 may constitute a front surface field region that forms a front surface field to prevent recombination. Then, since the emitter region that directly participates in photoelectric conversion is located on the back surface, the emitter region may be formed with a sufficient thickness (formed to be thicker than the front electric field region as an example) to further improve photoelectric conversion efficiency. However, the present disclosure is not limited thereto. Since the semiconductor substrate 122 may have the second conductivity type, the first conductive region 124 may constitute an emitter region, and the second conductive region 126 may also constitute a back surface field (BSF) region.

In this embodiment, the first conductive region 124 and the semiconductor substrate 122 may have an n type, and the second conductive region 126 may have a p type. Then, in the first photoelectric conversion part 110 located over the second photoelectric conversion part 120, a first transport layer 114 positioned on the upper side may transport electrons, and a second transport layer 116 positioned on the lower side may transport holes. In this case, the first photoelectric conversion part 110 may have an excellent effect. In addition, the semiconductor substrate 122 may have an n type, thereby prolonging the life time of the carriers. However, the present disclosure is not limited thereto, and the semiconductor substrate 122 has any one conductivity type of the first conductivity type and the second conductivity type, or has any one conductivity type of the n type and the p type, and can be modified in a variety of manners.

As an example, as a p-type dopant, a Group III element such as boron (B), aluminum (Al), gallium (Ga), or indium (In) may be used, and as an n-type dopant, a Group V element such as phosphorus (P), arsenic (As), bismuth (Bi), or antimony (Sb) may be used. A dopant of the semiconductor substrate 122 and a dopant of the first conductive region 124 or the second conductive region 126 may be a same material or different materials.

Herein, the first conductive region 124 and the second conductive region 126 may be entirely formed in the front surface and the back surface of the semiconductor substrate 122, respectively. Therefore, the first conductive region 124 and the second conductive region 126 may be formed with a sufficient area without additional patterning. However, the present disclosure is not limited thereto.

In this embodiment, it is illustrated that the first conductive region 124 and the second conductive region 126 are respectively composed of a first semiconductor layer and a second semiconductor layer formed separately with respect to the semiconductor substrate 122 or the base region. Therefore, crystal structures of the first conductive region 124 and the second conductive region 126 may be different from the semiconductor substrate 122. For example, the first conductive region 124 and the second conductive region 126 may respectively have an amorphous, microcrystalline, or polycrystalline structure to make the second photoelectric conversion part 120 have a hetero-junction structure. Therefore, the semiconductor substrate 122 may not be provided with a doped region and has excellent passivation properties, etc., and the first conductive region 124 and the second conductive region 126 may be easily formed by a simple process. In addition, costs may be reduced by reducing a thickness of the semiconductor substrate 122 which has excellent properties and is expensive. In particular, when the first conductive region 124 and the second conductive region 126 have an amorphous structure with being formed by a same semiconductor material (e.g., silicon) as the semiconductor substrate 122, a problem caused by a foreign material can be minimized, the first conductive region 124 and the second conductive region 126 can be formed at a low temperature, and efficiency of the solar cell 100 can be improved because the second photoelectric conversion part 120 has a high open voltage.

However, the present disclosure is not limited thereto. Therefore, in some embodiments, at least one of the first conductive region 124 and the second conductive region 126 may be a region having different conductivity type and doping concentration while having a same crystal structure as the base region. That is, at least one of the first conductive region 124 and the second conductive region 126 may be a doped region constituting part of the semiconductor substrate 122. A variety of other structures may apply.

A junction layer (tunneling junction layer) 110*a* is located on a front surface of the second photoelectric conversion part 120 to connect the second photoelectric conversion part 120 with the first photoelectric conversion part 110 located thereon. Although it is shown in the drawing that the junction layer 110*a* is in direct contact with the first conductive region 124 and the first photoelectric conversion part 110 respectively, the present disclosure is not limited thereto. The junction layer 110*a* may have a thin thickness, as an example, a thickness thinner than thicknesses of the first electrode layers 420 and 440, so that the carriers can tunnel smoothly.

The junction layer 110*a* may electrically connect the first photoelectric conversion part 110 with the second photoelectric conversion part 120, and may include a material that can transmit light (long-wavelength light as an example) used in the first photoelectric conversion part 110. As an example, the junction layer 110*a* may include at least one of a transparent conductive material (transparent conductive oxide as an example), a conductive carbon material, a conductive polymer, and n-type or p-type amorphous silicon. In some other embodiments, the junction layer 110*a* may be formed into a structure in which silicon layers having refractive indexes different from each other are alternately stacked, whereby light used in the second photoelectric conversion part 120 (short-wavelength light as an example) can be reflected by the second photoelectric conversion part 120 and light used in the first photoelectric conversion part 110 (long-wavelength light as an example) may be transmitted and supplied to the first photoelectric conversion part 110. However, the present disclosure is not limited thereto, and a variety of materials are applicable as a material, a structure, and the like of the junction layer 110*a*.

The first photoelectric conversion part 110 including the photoelectric conversion layer 112 including the perovskite compound may be positioned on the junction layer 110*a*. For example, the first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

The second transport layer 116 located on the junction layer 110a is a layer that extracts and transports second carriers (holes as an example) according to a bandgap relationship with the photoelectric conversion layer 112. As an example, the second carriers transported through the second transport layer 116 may pass through the junction layer 110a and move to the first photoelectric conversion part 110. The second transport layer 116 may include a variety of materials that can perform this function. For example, the second transport layer 116 may include a spirobifluorene compound (such as 2,2',7,7'-tetrakis(N,N-di-p-methoxyphenylamine)-9,9'-spirobifluorene (spiro-OMeTAD)), poly-triarylamine (PTAA), or a metal compound (such as molybdenum oxide), and as a self-assembly monolayer (SAM), may also include a material such as MeO-2PACz, 2PACz, or V1036. However, the present disclosure is not limited thereto, and a variety of materials may be used as the second transport layer 116.

The photoelectric conversion layer 112 on the second transport layer 116 may be formed by a perovskite compound having a perovskite structure, and may be a photoactive layer that can be excited by light to form carriers (electrons and holes). As an example, the perovskite structure may have a chemical formula of $AMX_3$ (herein, A is a monovalent organic ammonium cation or metal cation; M is a divalent metal cation; X means a halogen anion). This photoelectric conversion layer 112 serves as $AMX_3$, which may include $CH_3NH_3PbI_3$, $CH_3NH_3PbI_xCl_{(3-x)}$, $CH_3NH_3PbI_xBr_{(3-x)}$, $CH_3NH_3PbCl_xBr_{(3-x)}$, $HC(NH_2)_2PbI_3$, $HC(NH_2)_2PbI_xCl_{(3-x)}$, $HC(NH_2)_2PbI_xBr_{(3-x)}$, $HC(NH_2)_2PbCl_xBr_{(3-x)}$, and the like, or may include a compound in which A of $AMX_3$ is partially doped with Cs. However, the present disclosure is not limited thereto, and a variety of materials may be used as the photoelectric conversion layer 112.

The photoelectric conversion layer 112 formed by a perovskite compound may have a thickness greater than a predetermined thickness d1, and may have a thickness greater than that of the first conductive region 124.

As an example, the predetermined thickness d1 of the photoelectric conversion layer 112 may be 200 nm to 1 m or more, but is not limited thereto.

However, when the photoelectric conversion layer 112 is a thick film having a thickness greater than the predetermined thickness d1, photoelectric efficiency can be improved, and the photoelectric conversion layer 112, when transferred in the stacking direction, may be formed to have a perovskite structure from a region in contact with the second transport layer 116 to a region in contact with the first transport layer 114 while the composition of the perovskite compound is maintained in the stacking direction.

Therefore, in a boundary region serving as the region in contact with the first transport layer 114 or the region in contact with the second transport layer 116, a basic material layer for forming the perovskite compound does not remain. Therefore, the problem of carrier blocking caused by the residual basic material layer is eliminated, so that a large-area thick film can be formed while the photoelectric efficiency is ensured.

The photoelectric conversion layer 112 may have a plurality of droplet marks 101 formed on the surface.

The droplet marks 101 as described above may be generated by falling of droplets during the spraying of a material for forming the perovskite compound, which may form uneven structures at boundaries of the droplet marks 101.

However, the uneven structure of the droplet mark 101 has a height h1 lower than that of the uneven structure generated due to the texturing of the substrate 122, thereby not affecting light absorption and dispersion of the light-receiving surface.

In addition, through the formation of the photoelectric conversion layer 112 by spraying, a flat light-receiving surface in which the uneven structure of the lower substrate 122 is removed may be formed.

That is, the uneven structure of the droplet mark 101 is formed at a density lower than that of the uneven structure of the substrate 122, and the height h1 of the uneven structure of the droplet mark 101 is also lower, so the light absorption and the light dispersion of the light receiving surface are hardly affected.

The first transport layer 114 located on the photoelectric conversion layer 112 is a layer that extracts and transports first carriers (electrons as an example) through a bandgap relationship with the photoelectric conversion layer 112. The first transport layer 114 may include a variety of materials that can perform this function. For example, the first transport layer 114 may include fullerene (C60) or derivatives thereof (such as phenyl-C61-butyric acid methyl ester (PCBM)). However, the present disclosure is not limited thereto, and a variety of materials may be used as the first transport layer 114.

The first electrode 42 may be located on the first photoelectric conversion part 110 (the first transport layer 114 on the front surface thereof as an example), and the second electrode 44 may be located on the second photoelectric conversion part 120 (the second conductive region 126 on the back surface thereof as an example). That is, the solar cell 100 according to this embodiment may have a tandem structure in which the second photoelectric conversion part 120 based on a single semiconductor material (silicon as an example) is bonded to the first photoelectric conversion part 110 based on a perovskite compound through the junction layer 110a.

In this embodiment, the first photoelectric conversion part 110 has a larger bandgap than the second photoelectric conversion part 120. That is, the first photoelectric conversion part 110 has a relatively large bandgap to absorb a short wavelength that is a relatively small wavelength and uses the short wavelength to generate photoelectric conversion, and the second photoelectric conversion part 120 has a bandgap smaller than that of the first photoelectric conversion part 110 to effectively absorb a long wavelength that is a wavelength larger than that of the light used in the first photoelectric conversion part 110 and uses the long wavelength to generate photoelectric conversion.

In more detail, when light passes through the front surface of the solar cell 100 and is incident, the first photoelectric conversion part 110 absorbs short wavelengths to generate electrons and holes through photoelectric conversion. In this case, the first carriers (electrons as an example) move to the first electrode 42 and are collected, and the second carriers (holes as an example) pass through the first photoelectric conversion part 110 and the second photoelectric conversion part 120, move to the second electrode 420, and are collected. When a long wavelength passing through but not used in the first photoelectric conversion part 110 reaches the second photoelectric conversion part 120, the second photoelectric conversion part 120 absorbs the long wavelength and generates electrons and holes through photoelectric conversion. In this case, the first carriers (electrons as an example) move to the first electrode 42 through the first photoelectric conversion part 110 and are collected, and the second carriers (holes as an example) move to the second electrode 44 and are collected.

As described above, in this embodiment, since light having various wavelengths can be used in the photoelectric conversion parts 110 and 120, the efficiency of the solar cell 100 can be greatly improved. In particular, in this embodiment, a variety of properties may be improved by including the first photoelectric conversion part 110 based on a perovskite compound and the second photoelectric conversion part 120 having a hetero-junction structure. That is, both the first photoelectric conversion part 110 and the second photoelectric conversion part 120 above may be formed in a low-temperature process, and it is easy to adjust a temperature range due to similar process temperatures, so process matching is achieved. In addition, since the first photoelectric conversion part 110 and the second photoelectric conversion part 120 above respectively have excellent open voltages, the efficiency of the solar cell 100 with a tandem structure can be greatly improved. A variety of structures are applicable to the second photoelectric conversion part 120, and the second photoelectric conversion part 120 may not be provided, but only the first photoelectric conversion part 110 is provided. A variety of other modifications are possible.

In this embodiment, the first photoelectric conversion part 110 may be formed by a low-temperature process (a low-temperature process below 200° C. as an example), a temperature from room temperature to below 150° C. as an example, and in an embodiment, room temperature (a temperature above 20° C. and below 150° C. as an example).

The first electrode 42 may include a first electrode layer 420 and a second electrode layer 422 sequentially stacked on the photoelectric conversion parts 110 and 120. As an example, the first electrode layer 420 may be entirely formed (contact as an example) on the first photoelectric conversion part 110 (for example, the first transport layer 114). The term "entirely" includes not only the case where the entire first photoelectric conversion part 110 is covered without leaving an empty space or an empty area, but also the case where a portion of the first photoelectric conversion part 110 is inevitably excluded. As described above, when the first electrode layer 420 is entirely formed on the first conductive region 124, the carriers can easily reach the second electrode layer 422 through the first electrode layer 420, thereby reducing resistance in a horizontal direction.

As described above, the first electrode layer 420 is entirely formed on the first photoelectric conversion part 110, and thus may be composed of a material that can transmit light (a light-transmitting material). That is, the first electrode layer 420 is composed of a transparent conductive material to allow the carriers to move easily while enabling transmission of the light. Therefore, the first electrode layer 420 is entirely formed on the first photoelectric part 110 and does not block the transmission of the light. As an example, the first electrode layer 420 may include a transparent conductive material (for example, a transparent conductive oxide, indium tin oxide (ITO) or the like as an example), a carbon nano tube (CNT), and the like. However, the present disclosure is not limited thereto, and the first electrode layer 420 may include a variety of other materials.

The second electrode layer 422 may be formed (for example, in contact with) on the first electrode layer 420. The second electrode layer 422 may be composed of a material having better electrical conductivity than the first electrode layer 420. Therefore, properties such as carrier collection efficiency and resistance reduction according to the second electrode layer 422 can be further improved. As an example, the second electrode layer 422 may be composed of an opaque metal having excellent electrical conductivity, or a metal having lower transparency than the first electrode layer 420.

As described above, the second electrode layer 422 is opaque or has low transparency and hinders incidence of light, and thus may have a predetermined pattern to minimize shading loss. Therefore, light can be incident on a portion where the second electrode layer 422 is not formed. A planar shape of the second electrode layer 422 will be described in more detail later with reference to FIG. 2.

Similarly, the second electrode 44 may include a first electrode layer 440 and a second electrode layer 442 sequentially stacked on the second photoelectric conversion part 120. As an example, the first electrode layer 440 of the second electrode 44 may be entirely formed (contact as an example) on the second photoelectric conversion part 120 (for example, the second conductive region 126). Since mobility of the carriers may be low due to relatively low crystallinity of the second conductive region 126 composed of an amorphous semiconductor layer, the first electrode layer 440 is provided to reduce the resistance when the carriers move in the horizontal direction. The second electrode layer 442 of the second electrode 44 may be formed (for example, in contact with) on the first electrode layer 440 to have a predetermined pattern.

Except that the second electrode 44 is located on the second photoelectric conversion part 120, functions, materials, shapes, and the like of the first electrode layer 440 and the second electrode layer 442 of the second electrode 44 are the same as or similar to those of the first electrode layer 420 and the second electrode layer 422 of the first electrode 42, so the description thereof can be applied in a same manner. The first electrode layer 420 of the first electrode 42 and the first electrode layer 440 of the second electrode 44 may be identical to each other, or may be different in material, composition, shape, or thickness. The second electrode layer 422 of the first electrode 42 and the second electrode layer 442 of the second electrode 44 may be identical to each other, or may be different in material, composition, shape, or thickness. As a modified example, various layers of an antireflection film, a reflection film, and the like may also be located on the first electrode layers 420 and 440 of the first electrode 42 and the second electrode 44.

The second electrode layers 422 and 442 of the first electrode 42 and the second electrode 44 may have various planar shapes.

As an example, as shown in FIG. 2, the second electrode layers 422 and 442 may respectively include a plurality of finger electrodes 42a and 44a spaced apart from each other while having a constant pitch. Although it is illustrated in the drawing that the finger electrodes 42a and 44a are parallel to each other and parallel to edges of the photoelectric conversion parts 110 and 120 (the semiconductor substrate 122 as an example), the present disclosure is not limited thereto. In addition, the second electrode layer 422 and 442 may include bus bar electrodes 42b and 44b formed in a direction crossing the finger electrodes 42a and 44a and connected to the finger electrodes 42a and 44a. In some embodiments, only one bus bar electrodes 42b and 44b may be provided, and as shown in FIG. 2, or a plurality of bus bar electrodes 42b and 44b may be provided while having a pitch larger than that between the finger electrodes 42a and 44a. In this case, widths of the bus bar electrodes 42b and 44b may be greater than those of the finger electrodes 42a and 44a, but the present disclosure is not limited thereto. Therefore, the widths of the bus bar electrodes 42b and 44b may be equal to or less than those of the finger electrodes 42a and 44a.

The second electrode layer 422 of the first electrode 42 and the second electrode layer 442 of the second electrode 44 may have planar shapes identical to or different from each other. For example, the widths, pitches, and the like of the finger electrodes 42a and the bus bar electrodes 42b of the first electrode 42 may be the same as or different from those of the finger electrodes 44a and the bus bar electrodes 44b of the second electrode 44. In addition, the planar shapes of the second electrode layers 422 and 442 of the first electrode 42 and the second electrode 44 may be different from each other, and a variety of other modifications are possible.

As described above, in this embodiment, the first electrode 42 and the second electrode 44 of the solar cell 100 include the second electrode layers 422 and 442 made of an opaque metal or a metal having a predetermined pattern, and thus, the solar cell 100 has a bi-facial structure being able to receive light from the front surface and the back surface of the photoelectric conversion parts 110 and 120. Accordingly, an amount of light used in the solar cell 100 may be increased, so it is possible to contribute to improvement in efficiency of the solar cell 100. However, the present disclosure is not limited thereto, and various structures such as the second electrode layer 442 of the second electrode 44 being entirely formed on the back surfaces of the photoelectric conversion parts 110 and 120 are also possible.

As described above, in the first photoelectric conversion part 110 or the solar cell 100 provided with the photoelectric conversion layer 112 including a perovskite compound, as a large-area solar cell 100 with a length ranging from 10 cm to 20 cm on one side, the photoelectric conversion layer 112 may be a thick film with a thickness greater than the predetermined thickness d1, so the photoelectric efficiency can be ensured.

In this case, the photoelectric conversion layer 112 is formed by performing heat treatment after successive formation of a film of a first material A and a film of a second material B for forming the perovskite compound constituting the photoelectric conversion layer 112, so as to form a thick film with a desired thickness.

In this case, the film of the second material B formed after the formation of the film of the second material A is formed by spraying, so that a large-area thick film can be formed. After the formation of the perovskite compound resulting from the diffusion of the two material layers through heat treatment, all remaining second material B is removed through a washing process, thereby uniformly forming the perovskite compound in the stacking direction.

In addition, a second heat treatment is performed after the washing process, so that the height h1 of the uneven structure of the droplet mark 101 formed by spraying can be reduced while a lattice size is expanded, thereby improving the photoelectric efficiency and forming the photoelectric conversion layer 112 with a flat surface.

Therefore, the photoelectric conversion layer 112, when transferred in the stacking direction, may have a perovskite structure from a region in contact with the second transport layer 116 to a region in contact with the first transport layer 114 while the composition of the perovskite compound is constantly maintained in the stacking direction.

Therefore, in a boundary region serving as the region in contact with the first transport layer 114 or the region in contact with the second transport layer 116, the first material A and the second material B for forming the perovskite compound do not remain. Therefore, the problem of carrier blocking caused by the residue of the films of the first material A and the second material B is eliminated, so that a large-area thick film can be formed by spraying while the photoelectric efficiency is ensured.

A method for manufacturing the solar cell 100 having the above structure will be described in detail with reference to FIG. 3 and FIG. 6.

Figure 3:
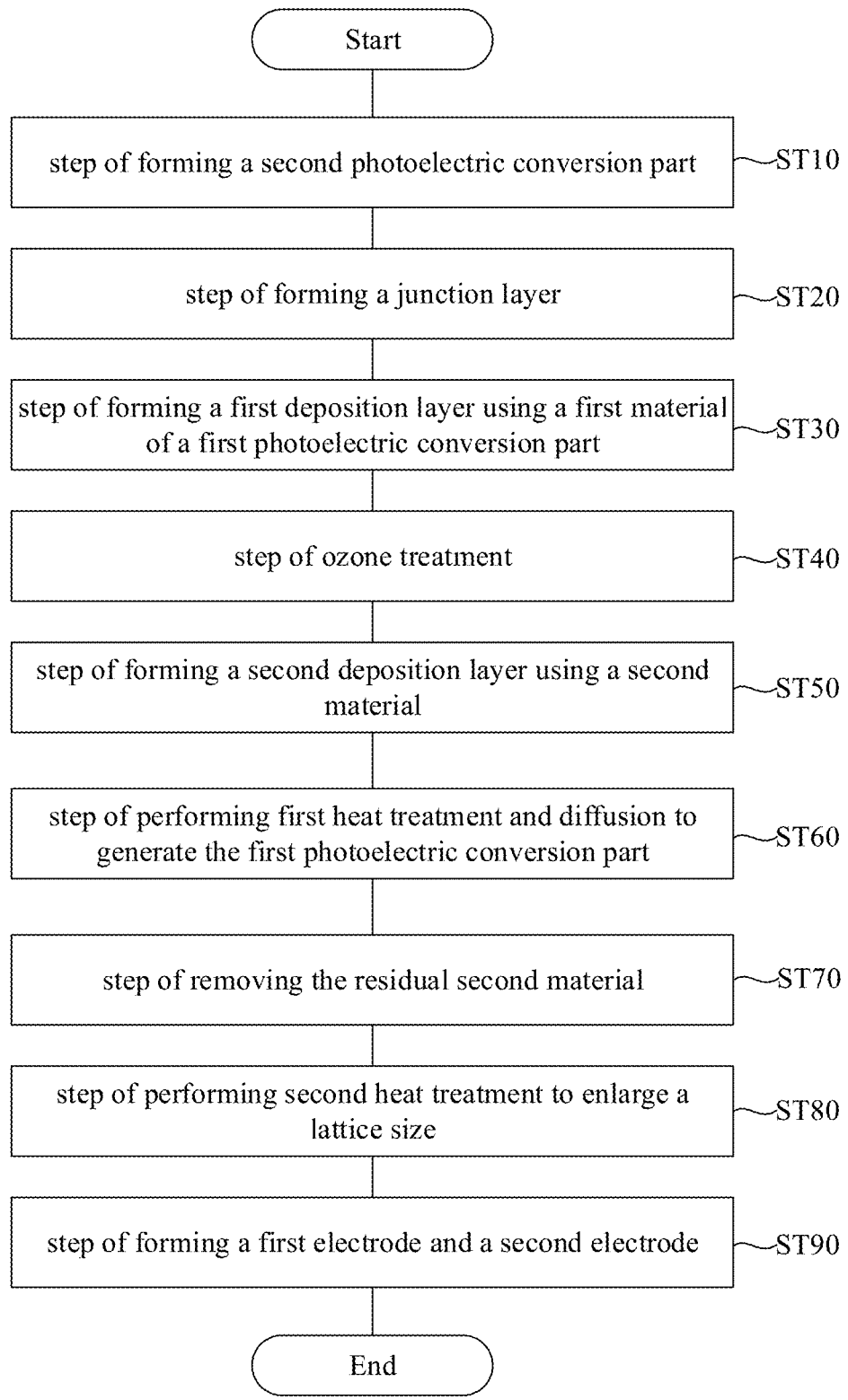
FIG. 3 is a flowchart of a method for manufacturing a solar cell according to some embodiments of the present disclosure.
Figure 4A:
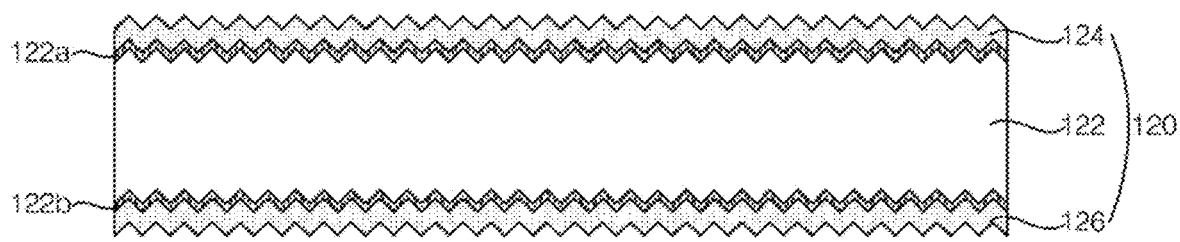
FIG. 4a to FIG. 4h are sectional views illustrating the method for manufacturing the solar cell shown in FIG. 3.
Figure 4B:
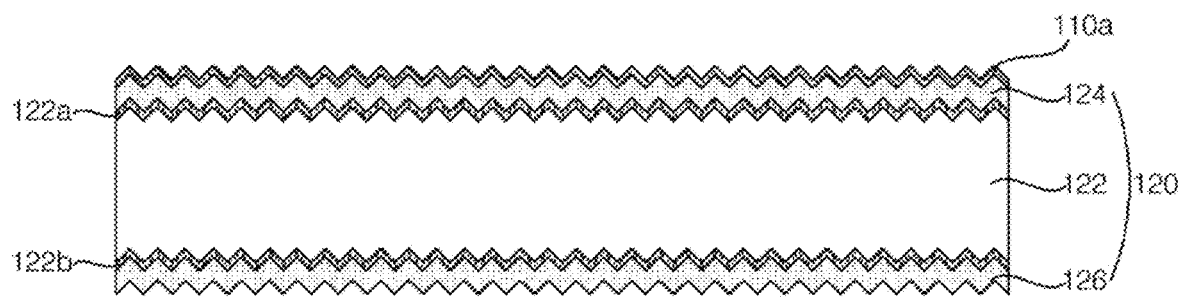
Figure 4C:
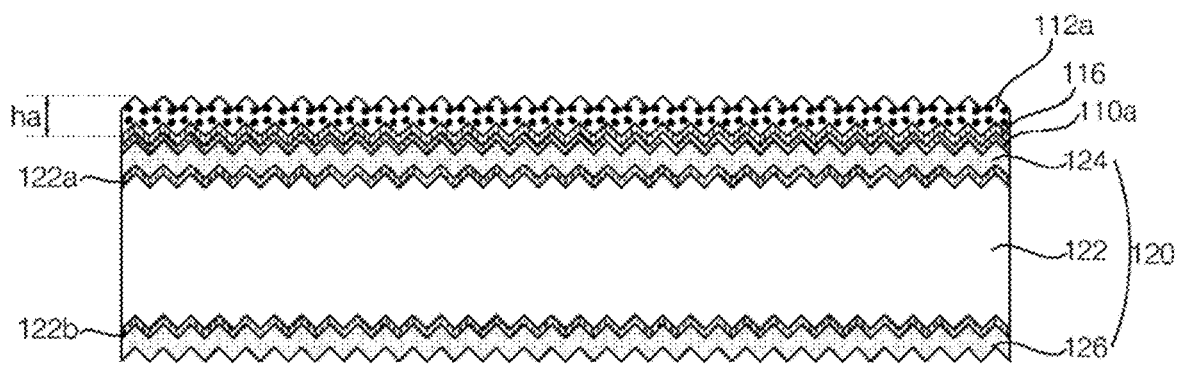
Figure 4D:
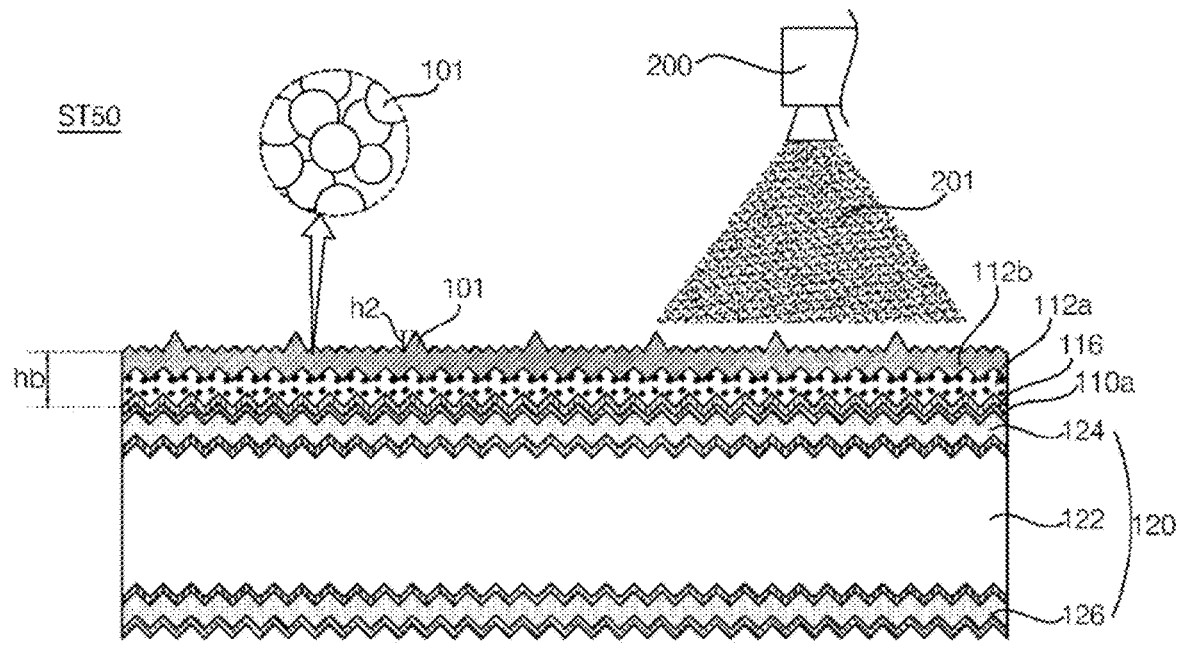
Figure 4E:
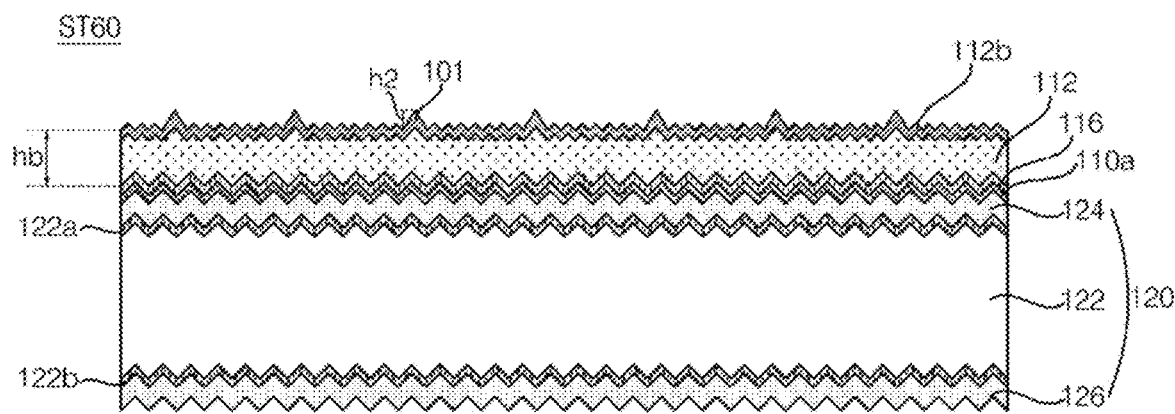
Figure 4F:
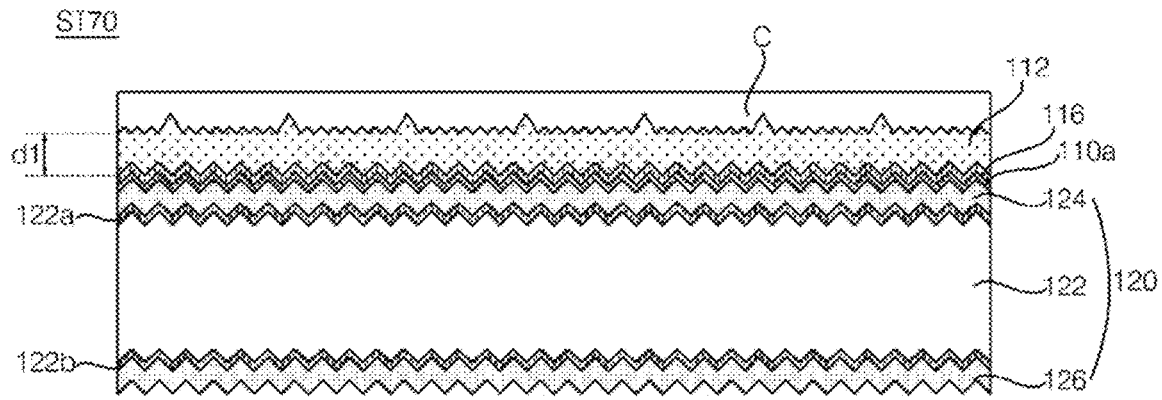
Figure 4G:
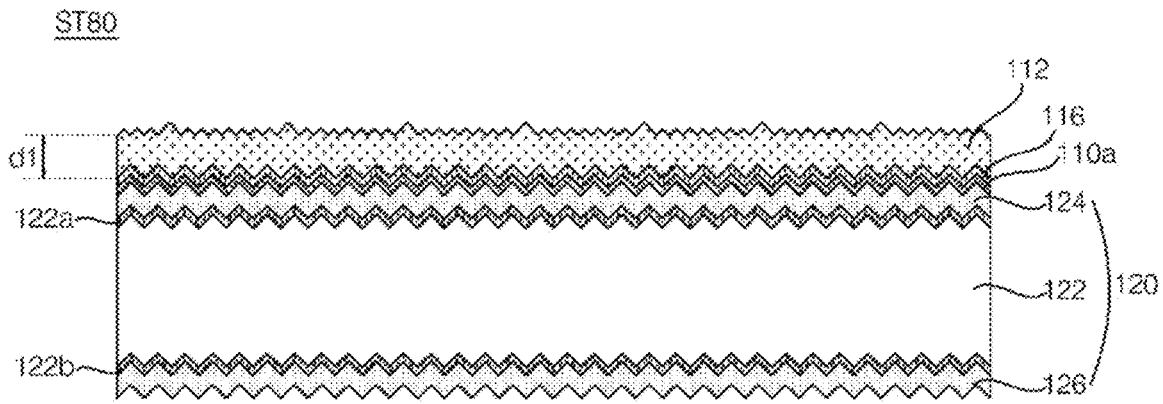
Figure 4H:
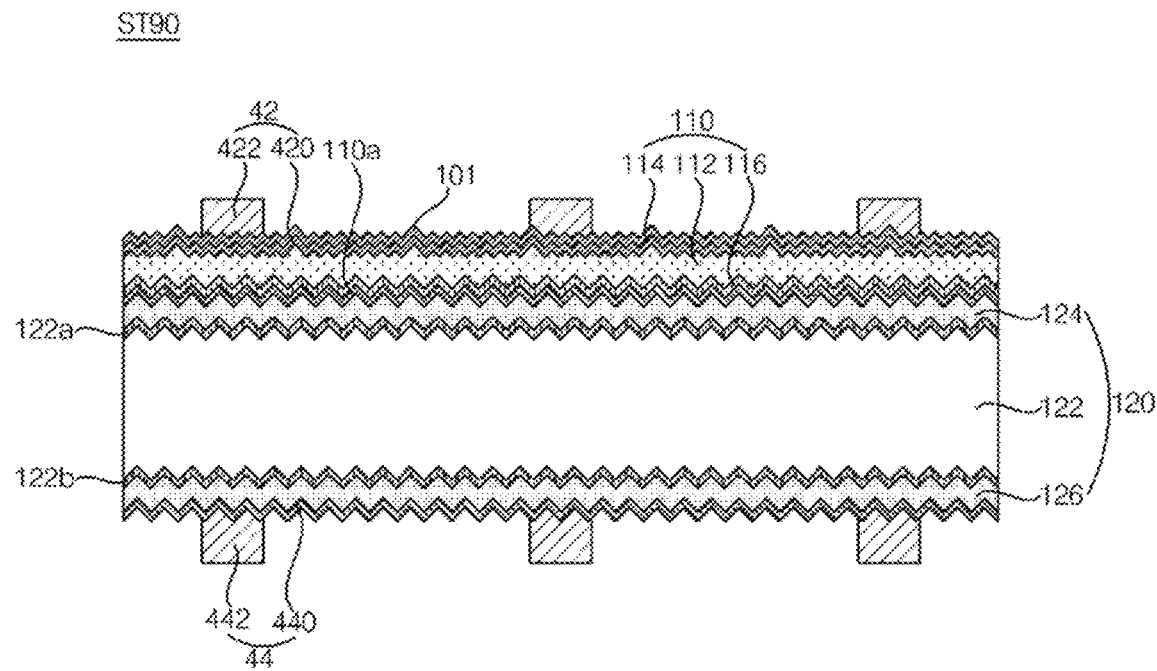
Figure 5:
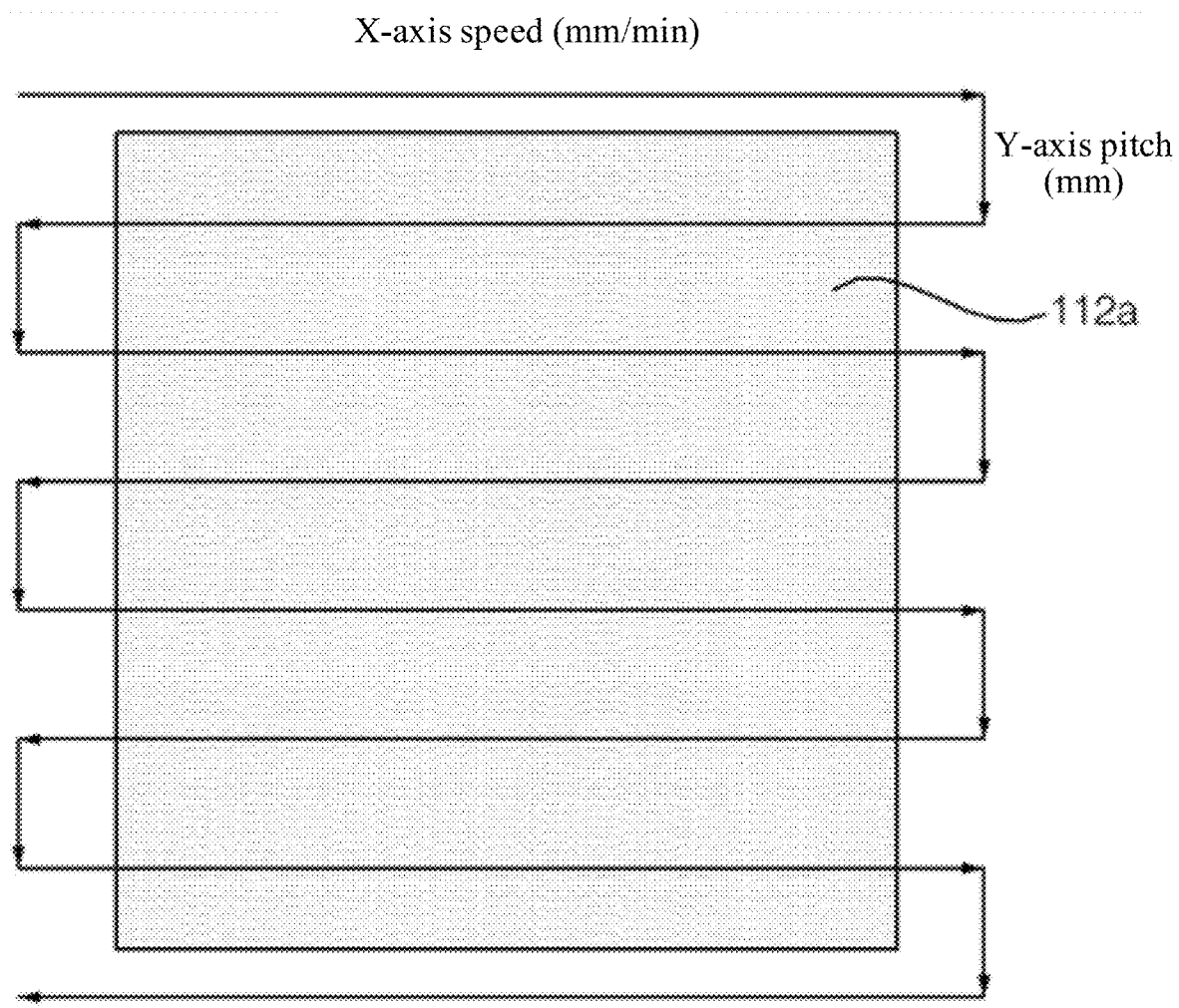
FIG. 5 is a conceptual diagram for describing a spraying method.
Figure 6A:
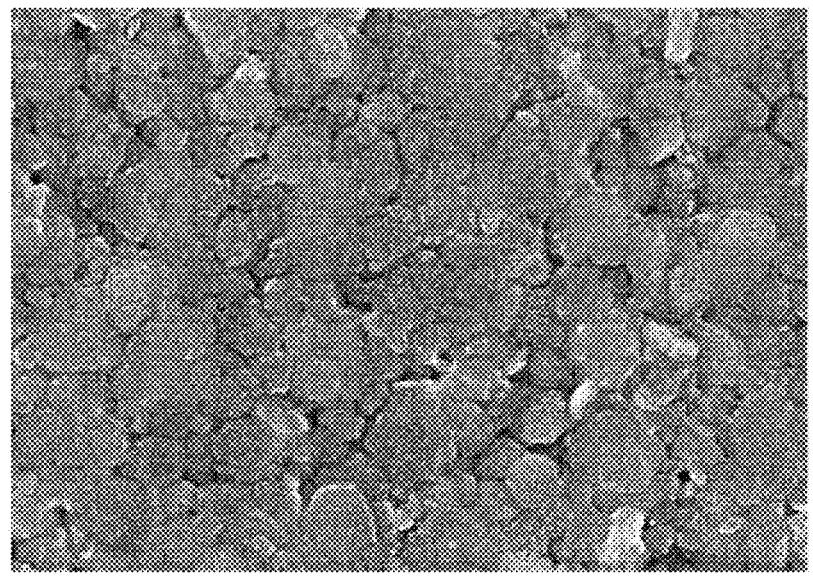
FIG. 6a and FIG. 6b show pictures of surfaces and sections according to some embodiments of the present disclosure.
Figure 6A:
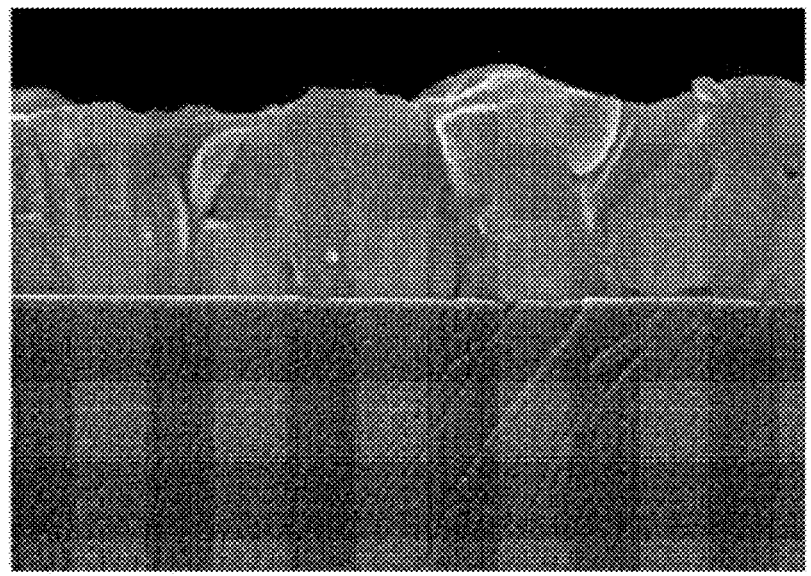
Figure 6B:
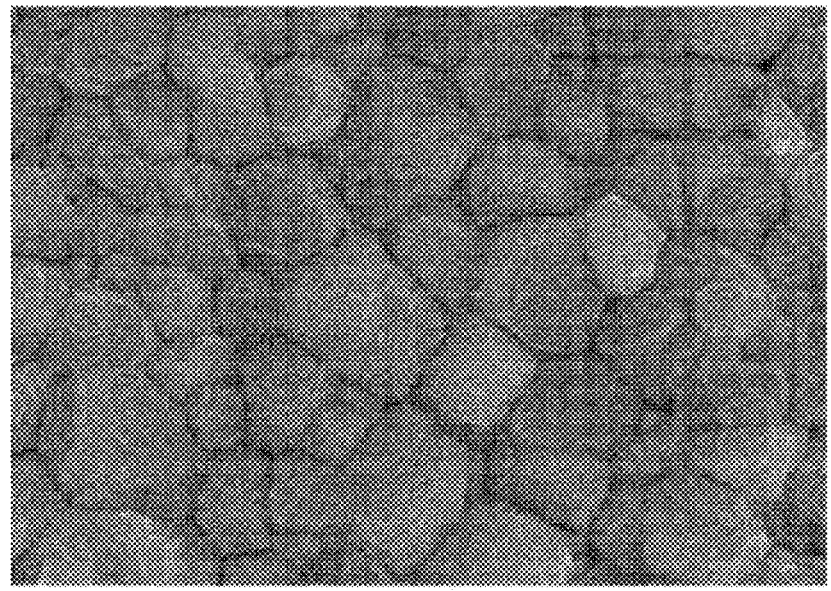
Figure 6B:
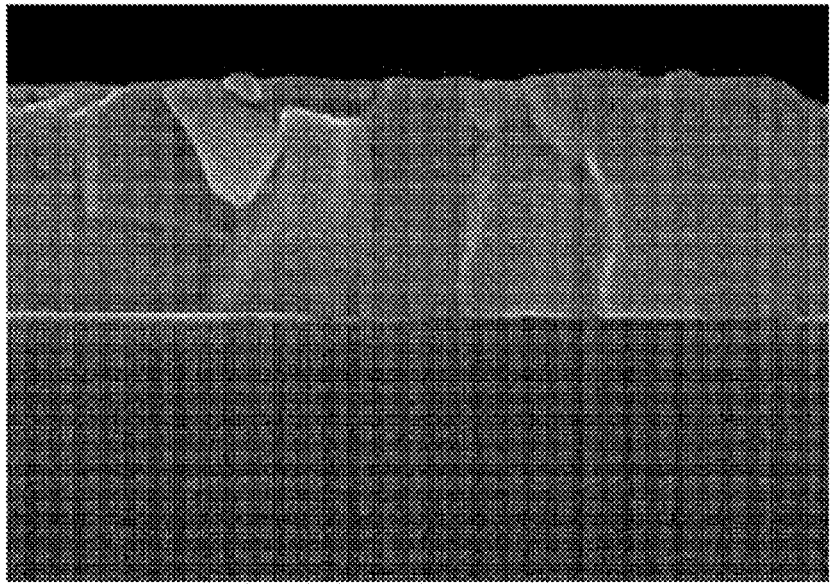

FIG. 3 is a flowchart of a method for manufacturing the solar cell 100 according to some embodiments of the present disclosure, FIG. 4a to FIG. 4h are sectional views illustrating the method for manufacturing the solar cell 100 shown in FIG. 3, FIG. 5 shows a scanning pattern for spraying, and FIG. 6a and FIG. 6b show pictures of surfaces and sections of the photoelectric conversion layer in a first heat treatment step and a second heat treatment step.

Referring to FIG. 3 to FIG. 6, the method for manufacturing the solar cell 100 according to this embodiment includes a step of forming a second photoelectric conversion part 120 (ST10), a step of forming a junction layer 110a (ST20), a step of forming a first film 112a of a first photoelectric conversion part 110 (ST30), a step of ozone treatment (ST40), a step of forming a second film 112b of the first photoelectric conversion part 110 (ST50), a step of performing a first heat treatment to generate the first photoelectric conversion part 110 (ST60), a washing step (ST70), a step of performing a second heat treatment to enlarge a lattice size (ST80), and a step of forming a first electrode 42 and a second electrode 44 (ST90). The steps shown in the sequence diagram more concretize and illustrate the step of forming the first photoelectric conversion part 110, and through the process, a uniform first photoelectric conversion part 110 with a large-area thick film can be formed. A more detailed description will be provided.

As shown in FIG. 4a, in the step of forming a second photoelectric conversion part 120 (ST10), the second photoelectric conversion part 120 including a semiconductor substrate 122, a first conductive region 124, a second conductive region 126, and the like is formed.

Firstly, the semiconductor substrate 122 including a base region having a first or second conductive dopant is prepared. In this case, at least one of a front surface and a back surface of the semiconductor substrate 122 may be textured to have unevenness to have an antireflection structure. As texturing of the surface of the semiconductor substrate 122, wet or dry texturing may be used for the texturing of the surface of the semiconductor substrate 122. The wet texturing may be performed by immersing the semiconductor substrate 122 in a texturing solution, and has an advantage of a short process time. In the dry texturing, the surface of the semiconductor substrate 122 is cut using a diamond grill, a laser, or the like, which may uniformly form the unevenness, but may have a long process time and cause damages to the semiconductor substrate 122. In addition, the semiconductor substrate 122 may be textured by reactive ion etching (ME) or the like. As described above, in the present disclosure, the semiconductor substrate 122 may be textured with various methods.

Subsequently, passivation films 122a and 122b and conductive regions 124 and 126 are entirely formed on the surface of the semiconductor substrate 122. For example, the first passivation film 122a and the first conductive region 124 are formed on the front surface of the semiconductor substrate 122, and the second passivation film 122b and the second conductive region 126 are formed on the back surface of the semiconductor substrate 122. Although it is illustrated in the drawing that the passivation films 122a and 122b are not formed on side surfaces of the semiconductor substrate 122, the passivation films 122a and 122b may also be located on the side surfaces of the semiconductor substrate 122.

As an example, the passivation films 122a and 122b and/or conductive regions 20 and 30 may be formed by thermal growth, deposition (e.g., chemical vapor deposition (PECVD), atomic layer deposition (ALD)), low-pressure chemical vapor deposition (LPCVD)), or the like. However, the present disclosure is not limited thereto, and the passivation films 122a and 122b may be formed with various methods. The first- or second-conductivity-type dopant may also be included in the process of growing semiconductor layers forming the conductive regions 124 and 126, and may also be doped by ion implantation, thermal diffusion, laser doping, or the like after formation of the semiconductor layers. However, the present disclosure is not limited thereto, and the conductive regions 124 and 126 may be formed with various methods.

The first passivation film 122a and the first conductive region 124 may be sequentially formed by changing a type of gas used during a continuous process performed on the front surface of the semiconductor substrate 122, and the second passivation film 122b and the second conductive region 126 may be sequentially formed by changing a type of gas used during a continuous process subsequently performed on the back surface of the semiconductor substrate 122. In some other embodiments, the second passivation film 122b and the second conductive region 126 may be sequentially formed by changing a type of gas used during a continuous process performed on the back surface of the semiconductor substrate 122, and the first passivation film 122a and the first conductive region 124 may be sequentially formed by changing a type of gas used during a continuous process subsequently performed on the front surface of the semiconductor substrate 122. In some other embodiments, the first conductive region 124 and the second conductive region 126 may be formed after simultaneous formation of the first passivation film 122a and the second passivation film 122b. In addition, a variety of modifications are possible.

Next, as shown in FIG. 4b, in the step of forming the junction layer 110a (ST20), the junction layer 110a is formed on the second photoelectric conversion part 120. In an embodiment, the junction layer 110a may be formed on the first conductive region 124 in the second photoelectric conversion part 120. As an example, the junction layer 110a may be formed by sputtering. A sputtering process may be performed at a low temperature, and as a single-sided process, the junction layer 110a may be formed only on the second conductive region 124. However, the present disclosure is not limited thereto, and various methods such as a coating method are applicable.

In this case, a protective layer for protecting the second conductive region 126 may also be formed in the process of forming the junction layer 110a.

As described above, when the protective layer is formed, the protective layer protects the second conductive region 126 on the second conductive region 126 in a manufacturing process, and can remain as it is and function as the first electrode layer 440, but is not limited thereto.

However, the protective layer, when functioning as the first electrode layer 440, is formed before the formation of the first photoelectric conversion part 110 and is used as the protective layer, thereby simplifying the process. However, the present disclosure is not limited thereto, and a protective layer different from the first electrode layer 440 may be separately formed and the first electrode layer 440 is formed with or without removing the protective layer.

Subsequently, as shown in FIG. 4c, the first film 112a for forming the first photoelectric conversion part 110 is formed (ST30).

That is, the first photoelectric conversion part 110 is formed on the junction layer 110a. In an embodiment, the second transport layer 116 is formed on the junction layer 110a, and the first film 112a for forming the photoelectric conversion layer 112 is sequentially formed thereon.

The second transport layer 116 may be formed by deposition (such as physical deposition or chemical deposition) or the like. Herein, a printing method may include inkjet printing, gravure printing, spraying, doctor blading, bar coating, gravure coating, brush coating, slot-die coating, and the like. However, the present disclosure is not limited thereto.

The first film 112a for forming the photoelectric conversion layer 112 is formed on the second transport layer 116.

The first film 112a may be formed by chemical deposition, and as an example, may be formed by vacuum deposition.

For example, when the first material A and the second material B are required as molecules forming the perovskite compound constituting the photoelectric conversion layer 112, the film of the first material A and the film of the second material B may sequentially formed to form the corresponding perovskite compound.

In this case, as shown in FIG. 4c, the first material A may be deposited to form the first film 112a including the first material A.

The first material A may be an inorganic material constituting the perovskite compound, and as an example, may be a metal halide having an $MX_2$ structure. As an example, when the perovskite compound is $CH_3NH_3PbI_3$, the first material A may be $PbI_2$.

In a vacuum deposition process, the first film 112a is formed on the second transport layer 116 during evaporation at a rate of 1 Å/s to 2 Å/s by using the first material A as a source.

In this case, a deposition rate may be adjusted while a deposition temperature of the first material A is adjusted.

As shown in FIG. 4c, the first film 112a may be deposited such that the first material A constituting the perovskite compound has a first thickness ha.

In this case, the first thickness ha may be 0.3 to 0.8 times, 0.6 to 0.7 times in some embodiments, of the predetermined thickness h1 constituting the final photoelectric conversion layer 112, and the predetermined thickness h1 of the final photoelectric conversion layer 112 is determined according to a thickness of the first film 112a.

That is, 1.5 times to 3 times, 2 times in some embodiments, of the first thickness ha of the first film 112a meets the predetermined thickness h1 of the final photoelectric conversion layer 112.

Therefore, the first thickness ha of the first film 112a may range from 130 nm to 550 nm.

In a case where the first film 112a is formed to have the first thickness ha by deposition, the first film 112a having unevenness on the surface may be formed according to the texturing of the substrate 122.

In addition, the first film 112*a* can also be formed by a wet process.

As an example, the first film 112*a* can be formed by a wet process such as deep coating, doctor blading, or spraying.

As described above, if the first film 112*a* is formed by the wet process, a drying process may be additionally performed. If the first film 112*a* is formed by the wet process, the surface of the first film 112*a* may absorb the texturing of the substrate to be formed flat without unevenness on the surface. However, in order to form a film with a desired thickness through the wet process as described above, a post-treatment process may be required.

Next, ozone treatment may be performed on the surface of the first film 112*a* (ST40).

The ozone treatment may be performed after the formation of the first film 112*a* and before the formation of the second film 112*b*. Moreover, when the first film 112*a* is washed with a UV lamp in an oxygen atmosphere, generated ozone as a strong oxidant directly oxidizes impurities on the surface of the first film 112*a*, and strong energy of UV causes organic bonding between the surface of the first film 112*a* and the impurities, thereby oxidizing and evaporating the impurities. In this case, a UV wavelength band used may range from 150 nm to 400 nm, and energy of the UV wavelength band may be more than organic bonding energy of the surface and break the organic bonding of the surface.

Therefore, the surface of the first film 112*a* may be changed into a hydrophilic surface by dry washing, and a contact angle and surface tension between the droplet and the first film 112*a* later may be reduced due to the washing of the surface of the first film 112*a* as described above, thereby alleviating the droplet mark 101. That is, when the contact angle between the droplet and the first film 112*a* is above 40° prior to the ozone treatment, the contact angle may be reduced below 5° after the ozone treatment.

Therefore, the unevenness of the droplet mark 101 of a liquid droplet sprayed according to a spraying process for forming the second film 112*b* becomes very low.

Next, as shown in FIG. 4*d*, the second film 112*b* is formed on the first film 112*a* (ST50).

The second film 112*b* may be formed using the second material B which is another material constituting the perovskite compound, and the second material B may be an organic material.

As an example, the second material B may be an organic ammonium halide having an AX structure. As an example, when the perovskite compound is CH3NH3PbI3, the second material B can be CH3NH3I.

The second film 112*b* can be formed on the first film 112*a* by a wet process of the second material B by using a coating method according to spraying.

For spraying, a spray solution including the second material B is prepared. In this case, as a solvent that can dissolve the second material B, an alcoholic solvent with a viscosity of 100 cP or less at room temperature is applicable. In an embodiment, the solvent may be methanol, ethanol, isopropyl alcohol (IPA), or the like, which may be IPA in some embodiments, but differently, at least two alcoholic solvents may be mixed.

In an embodiment, the spray solution may be formed by dissolving the second material B in an alcoholic solvent so that concentration of the second material B satisfies a range from 1 mg/ml to 100 mg/ml.

In the case of an alcoholic solvent, the second film 112*b* composed only of the second material B may be formed on the first film 112*a* while being in contact with the substrate and evaporating.

In this case, as shown in FIG. 4*d*, the spray solution may be sprayed on the substrate through a nozzle 200 of a spraying device, and as shown in FIG. 5, the nozzle 200 sprays the first film 112*a* while moving along an x-axis and a y-axis in a zigzag manner.

In addition, a thickness of the second film 112*b* may be determined according to a moving speed, a spraying speed, and concentration of the solution.

In addition, when the spray nozzle 200 sprays the substrate and moves in the zigzag manner along the x-axis and the y-axis with respect to the substrate, a deviation of a liquid droplet 201 applied to the first film 112*a* is determined according to a pitch of the y-axis.

That is, when the pitch of the y-axis is large, a deviation between a region where the droplet 201 is applied and a region where no droplet is applied by the spraying becomes very large, so that the second film 112*b* is formed in a wave shape.

Therefore, the imbalance as described above can be reduced by reducing the pitch of the y-axis, so that spraying is performed for multiple times in a single area.

That is, when a pitch of a region covered by spraying once by the spray nozzle 200 is a and the pitch of the y-axis of a moving path of the nozzle 200 is b, a desired number of recoating times for a single region may be set to a/b.

As an example, when a single region is sprayed for two times, the pitch of the y-axis of the nozzle 200 may be set to ½ of the region covered by spraying. In some embodiments of the present disclosure, at least more than one repeated spraying may be performed for the pitch of the y-axis.

Through the repeated spraying as described above, the entire region can be sprayed with a uniform thickness, and therefore, the second film 112*b* may be formed with a uniform thickness.

The second film 112*b* may have a sufficiently thick thickness by the repeated spraying as described above, and in this case, the thickness of the second film 112*b* may be formed such that a sum hb of the thickness and the first thickness ha of the lower first film 112*a* is greater than the predetermined thickness h1 of the final photoelectric conversion layer 112.

Although the use of the zigzag spraying of one spray nozzle 200 is shown above, the present disclosure is not limited thereto, and a manner of spraying in one direction by using a plurality of nozzles is applicable.

As described above, the formed second film 112*b* forms, by spraying, the droplet marks 101 on the substrate during contact with the first film-forming layer 112*a* of the substrate in a state where the spray solution are droplets 201.

Therefore, as shown in FIG. 4*d*, an uneven structure may be formed at boundaries of the droplet marks 101.

The droplet mark 101 as described above may have a circular or elliptical form, and may have a superimposed circular or elliptical formed by some superimposed droplets 201.

In this case, a diameter of each droplet mark 101 may vary depending on the viscosity of the solvent, and may approximately range from 0.1 μm to 1000 μm, but is not limited thereto. In this case, a height h2 of the droplet mark 101 (i.e., a height of the uneven structure) may be greater than that of the uneven structure of the droplet mark 101 in FIG. 1 and may be formed at a higher density than the droplet mark 101 in FIG. 1.

Next, as shown in FIG. 4e, the photoelectric conversion layer 112 having a perovskite compound of AMX3 is formed by performing a first heat treatment to vaporize the second material B and diffuse the second material B, so that the second material B is diffused into the first material A during vaporization (ST60).

As described above, the formed photoelectric conversion layer 112 can be formed into a thick film having a thickness greater than the predetermined thickness d1.

The first heat treatment may be performed so that the perovskite compound is formed while the second material B is diffused into the first film 112a of the first material A, and a perovskite structure is formed up to an interface with the first transport layer 114.

In this case, the photoelectric conversion layer 112 is formed into a thick film ranging from 200 μm to 1 μm that is greater than the predetermined thickness d1, and the predetermined thickness d1 is between 1.5 times and 3 times of the thickness of the first film 112a.

Therefore, heat treatment is performed until the first film 112a is completely converted into the photoelectric conversion layer 112, and the first heat treatment can be performed between 50° C. to 200° C. for the first time length.

As described above, after the first heat treatment, the first film 112a is completely converted into the photoelectric conversion layer 112, or a part of the excessively formed second film 112b remains on the photoelectric conversion layer 112.

To this end, the washing step is performed after the first heat treatment (ST70).

In the washing step, in order to remove the residual second film 112b on the photoelectric conversion layer 112, the substrate is washed with an alcoholic solvent C that is the solvent for dissolving the second material B in the formation of the second film 112b.

The removing of the residual second material B (i.e., an organic material) as described above may use a same solvent as the solvent used during the formation of the second film 112b. IPA is applicable in some embodiments.

Therefore, the organic material on the photoelectric conversion layer 112 that does not constitute the perovskite compound is dissolved and removed using the alcoholic solvent C, and only the photoelectric conversion layer 112 is left.

Therefore, at the boundary with the first transport layer 114 and the boundary with the second transport layer 116, there will not exist the first film 112a composed only of the first material A or the second film 112b composed only of the second material B.

The exposed photoelectric conversion layer 112 has the predetermined thickness d1, and the droplet marks 101 also remain on the surface of the photoelectric conversion layer 112, but the organic material causing the droplet marks 101 is also removed by washing the organic material. Therefore, the height h2 of the uneven structure formed at the boundary of the droplet mark 101 decreases.

Therefore, the uneven structure may have a same first height h1 as the uneven structure of the droplet mark 101 in FIG. 1, and in the case of the droplet mark 101 with a lower height, the uneven structure is dissolved and removed, thereby reducing the density of the droplet mark 101 also as shown in FIG. 1.

Next, as shown in FIG. 4g, a second heat treatment is performed (ST80).

The second heat treatment may be performed after the washing process in which the residual second film 112b is removed, and may be performed at a temperature between 50° C. and 200° C. for the second time length in the same way as the first heat treatment.

Through the second heat treatment as described above, particles for forming the perovskite compound are recrystallized and a size of a crystal is expanded. Therefore, uniform and large crystal particles can be formed.

Through the two-stage heat treatment as described above (i.e., heat treatment prior to the washing and heat treatment after the washing), as shown in FIG. 6, it may be observed that surface roughness is reduced while a particle size becomes larger.

For example, FIG. 6a shows a picture of a surface and a section view of the photoelectric conversion layer 112 that is washed after the first heat treatment, and FIG. 6b shows a picture of a surface and a section view of the photoelectric conversion layer 112 after the second heat treatment.

A perovskite crystal having a particle size of about 10 nm to 300 nm is formed on the surface of the exposed photoelectric conversion layer 112 that is washed after the first heat treatment, and it may be observed that the surface roughness is also about 50 nm to 200 nm. That is, a rough surface is formed due to the unevenness of the droplet mark 101 and the small particle size.

In this case, when the second heat treatment is performed after the washing, defects within the crystal are thereby reduced while determined sizes of the particles are enlarged to 50 nm to 500 nm, and the residual organic material present in the perovskite is removed. Therefore, it may be observed that the surface roughness is also reduced to 5 nm to 100 nm.

The first time length and the second time length of the first heat treatment and the second heat treatment can be set to 1:1, but are not limited thereto, and as an example, the first heat treatment and the second heat treatment may be carried out for 30 minutes.

As described above, the second heat treatment is additionally performed after the washing process of the residual organic material, so that the size of the crystal is increased, the solvent used in washing can be dried, and the residual organic material is removed, thereby improving efficiency of a subsequent process.

In some embodiments of the present disclosure in which the second film 112b is excessively formed, when the perovskite compound is formed only by the first heat treatment with the lattice size being enlarged, the unreacted second material B in the excessively formed second material B may be further injected into the perovskite compound, and the organic-excess perovskite compound layer forms the photoelectric conversion layer 112.

When the organic material is excessively injected into the photoelectric conversion layer 112, there is a problem that photoelectric efficiency is lowered. In order to prevent the above problem, in some embodiments of the present disclosure, the second heat treatment is performed after the first heat treatment and the removing of the residual second material B by washing, so that lattice enlarging efficiency can be increased, and there may be an effective effect on removal of residues according to the washing process.

Next, the first transport layer 114 is formed on the formed photoelectric conversion layer 112.

The first transport layer 114 may be formed with various methods, and as an example, may be formed by deposition (such as physical deposition or chemical deposition), printing, or the like. Herein, the printing method may include inkjet printing, gravure printing, spraying, doctor blading, bar coating, gravure coating, brush coating, slot-die coating, and the like. However, the present disclosure is not limited thereto.

Next, as shown in FIG. 4h, the first electrode 42 and the second electrode 44 are formed (ST90).

In an embodiment, when the first electrode layer 420 of the first electrode 42 is formed on the first photoelectric conversion part 110, the first electrode layer 420 of the first electrode 42 may be formed on the first transport layer 114. In this case, although the first electrode layer 440 of the second electrode 44 may be formed on the second photoelectric conversion part 120, when the protective layer is used as the first electrode layer 440, the first electrode layer 440 may be omitted.

As an example, the first electrode layer 420 of the first electrode 42 may be formed by sputtering. A sputtering process may be performed at a low temperature, and the first electrode layer 420 of the first electrode 42 may be formed only on a front surface of a single side. However, the present disclosure is not limited thereto, and various methods such as a coating method are applicable.

Next, the second electrode layers 422 and 442 of the first electrode 42 and the second electrode 44 are formed.

The second electrode layers 422 and 442 of the first electrode 42 and the second electrode 44 may be form the second electrode layer 422 of the first electrode 42 on the first electrode layer 420 of the first electrode 42 and the second electrode layer 442 of the second electrode 44 on the first electrode layer 440 of the second electrode 44 at the same time, thereby simplifying the process. However, the present disclosure is not limited thereto.

In this embodiment, a process is proposed in which a compound with a uniform composition having a large lattice can be formed in the stacking direction when the photoelectric conversion layer 110 composed of the perovskite compound is formed into a large-area thick film in the solar cell 100 provided with the first photoelectric conversion part 110 including the perovskite compound.

That is, when heat treatment is performed to form a perovskite compound by diffusion after the inorganic material and the organic material constituting the perovskite compound are layered separately, the photoelectric conversion layer 112 composed only of the perovskite structure can be formed without residues of the inorganic material and the organic material in each boundary surface, regardless of layering with a sufficient thickness for forming a thick film.

To this end, after the inorganic material layer is formed into a first thickness ha by deposition and the organic material layer is excessively formed by spraying, after the perovskite compound layer is formed to have a residual organic material layer by heat treatment, the residual organic material layer is removed by a washing process.

Therefore, while the thickness d1 of the perovskite compound layer for forming a thick film is controlled by the thickness ha of the inorganic material layer formed by deposition, the organic material layer can be formed sufficiently thick by spraying, so that the residual organic material layer remains, and fabrication of a large-area substrate can be easily formed.

In addition, after the the perovskite compound is formed by the first heat treatment and before the washing of the residual organic material layer, the enlargement of the lattice size and the removal of the residues are performed by the second heat treatment after the washing, so that both the lattice size and the process efficiency can be ensured.

In this case, the first photoelectric conversion part 110 having the perovskite structure shown in FIG. 1 to FIG. 6 can be formed above, and a quantum-type solar cell 100 having a second photoelectric conversion part 130 as described in the following can also be formed below.

A quantum-type solar cell according to another example of the present disclosure will be described below with reference to FIG. 7.

Figure 7:
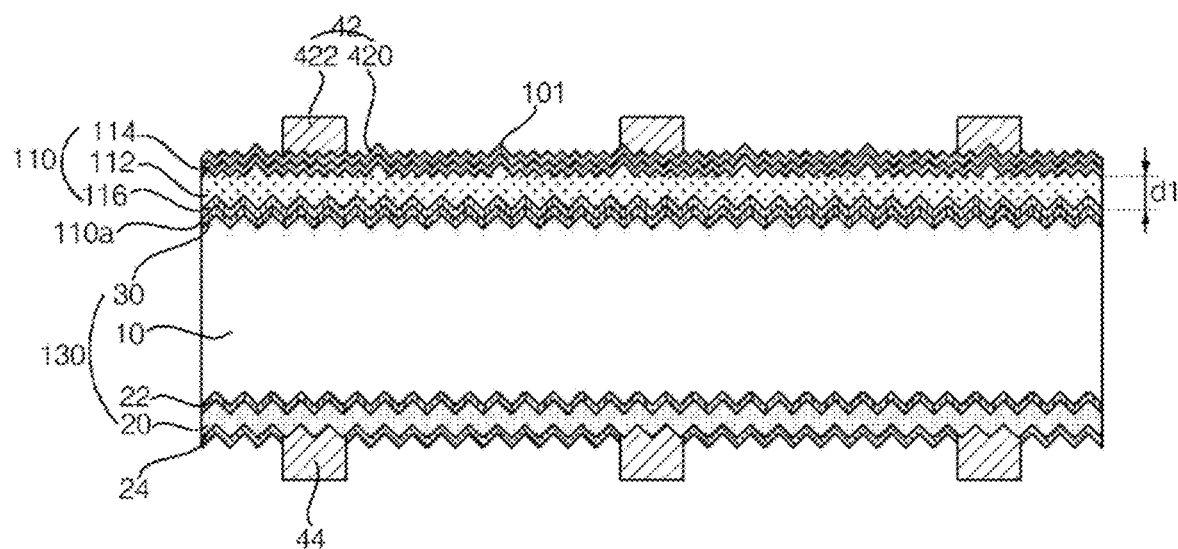
FIG. 7 is a sectional view of a solar cell according to one or more modified embodiments of the present disclosure.

Referring to FIG. 7, the quantum-type solar cell according to the another example of the present disclosure may further include a tandem structure of a first photoelectric conversion part 110 including a photoelectric conversion layer 112 including a perovskite compound and a second photoelectric conversion part 130 having a different material or structure from the first photoelectric conversion part 110.

In the solar cell 100 according to this example, the second photoelectric conversion part 130 may include a semiconductor substrate 10, a first conductive region 20 on one side of the semiconductor substrate 10 and having the first conductivity type, and a second conductive region 30 on the other side of the semiconductor substrate 10 and having the second conductivity type. A second electrode 44 connected to the first conductive region 20 is included. In addition, the second photoelectric conversion part 130 may further include an insulating film such as a first passivation film 24. This will be described in detail.

The semiconductor substrate 10 may be composed of a crystalline semiconductor including a single semiconductor material (a Group IV element as an example). As an example, the semiconductor substrate 10 may be composed of a monocrystalline or polycrystalline semiconductor (monocrystalline or polycrystalline silicon as an example). In particular, the semiconductor substrate 10 may be composed of a monocrystalline semiconductor (for example, a monocrystalline semiconductor wafer, a monocrystalline silicon wafer in an embodiment). As described above, when the semiconductor substrate 10 is composed of a monocrystalline semiconductor (e.g., monocrystalline silicon), the solar cell 100 is based on the semiconductor substrate 10 composed of a monocrystalline semiconductor with high crystallinity and few defects. Therefore, the solar cell 100 may have excellent electrical properties.

A front surface and/or a back surface of the semiconductor substrate 10 may be textured to have unevenness. The unevenness may have, for example, a pyramid shape in which an outer surface is configured as a (111) surface of the semiconductor substrate 10 and has an irregular size.

The semiconductor substrate 10 includes a base region 10 doped with a first-conductivity-type dopant or a second-conductivity-type dopant at low doping concentration and having the first or second conductivity type. In this case, the base region 10 of the semiconductor substrate 10 may have lower doping concentration, higher resistance, or lower carrier density than one of the first conductive region 20 and the second conductive region 30 having a same conductivity type.

The first conductive region 20 having the first conductivity type may be located on the back surface of the semiconductor substrate 10. As an example, a tunneling layer 22 may be formed on the semiconductor substrate 10, and the first conductive region 20 may be formed on the tunneling layer 22.

The tunneling layer 22 may be formed on and in contact with the back surface of the semiconductor substrate 10, thereby simplifying the structure and improving a tunneling effect. The tunneling layer 22 may act as a barrier for electrons and holes so as not to allow minority carriers to pass, and after accumulation in a portion adjacent to the tunneling layer 22, only majority carriers with energy above a predetermined amount pass through the tunneling layer 22. In this case, the majority carriers with energy above the predetermined amount can easily pass through the tunneling layer 22 due to the tunneling effect. In addition, the tunneling layer 22 performs a function as a diffusion barrier that prevents diffusion of the dopant in the first conductive region 20 into the semiconductor substrate 10. The tunneling layer 22 may include various materials that allow the majority carriers to tunnel, and as an example, may include oxides, nitrides, semiconductors, conductive polymers, and the like. In particular, the tunneling layer 22 may be composed of a silicon oxide layer including silicon oxide. This is because a silicon oxide layer is a film with excellent passivation properties and easy carrier tunneling.

A thickness of the tunneling layer 22 may be less than the thickness of the first passivation film 24, the thickness of the first conductive region 20, or the thickness of the second conductive region 30 so as to fully achieve the tunneling effect. As an example, the thickness of the tunneling layer 22 may be less than 2 nm, and as an example, may range from 0.1 nm to 1.5 nm (0.5 nm to 1.5 nm in an embodiment). When the thickness of the tunneling layer 22 exceeds 2 nm, tunneling cannot occur smoothly, so the efficiency of the solar cell 100 may be reduced, and when the thickness of the tunneling layer 22 is less than 0.1 nm, it may be difficult to form the tunneling layer 22 of desired quality. In order to fully achieve the tunneling effect, the thickness of the tunneling layer 22 may range from 0.1 nm to 1.5 nm (0.5 nm to 1.5 nm in an embodiment). However, the present disclosure is not limited thereto, and the thickness of the tunneling layer 22 may have various values.

The first conductive region 20 may be a region including a first-conductivity-type dopant and having the first conductivity type. As an example, the first conductive region 20 may contact and be formed on the tunneling layer 22, thereby simplifying the structure of the solar cell 100 and maximizing the tunneling effect of the tunneling layer 22. However, the present disclosure is not limited thereto.

The first conductive region 20 may include a same semiconductor material as the semiconductor substrate 10 (e.g., a single semiconductor material, silicon as an example). Then, the second conductive region 30 may have similar properties to the semiconductor substrate 10, so that differences in properties that may occur when semiconductor materials different from each other are included are minimized. However, since the first conductive region 20 is separately formed on the semiconductor substrate 10 with respect to the semiconductor substrate 10, the first conductive region 20 may have a crystal structure different from that of the semiconductor substrate 10 so as to be easily formed on the semiconductor substrate 10.

For example, the first conductive region 20 may be formed by doping the first-conductivity-type dopant on an amorphous semiconductor, a microcrystalline semiconductor, a polycrystalline semiconductor (amorphous silicon, microcrystalline silicon, or polycrystalline silicon as an example), or the like that can be easily manufactured with various methods such as deposition. In particular, the first conductive region 20 may include a polycrystalline semiconductor (polycrystalline silicon as an example). Then, due to excellent electrical conductivity, the carriers can move smoothly, and smooth tunneling of the carriers can be guided in the tunneling layer 22 composed of oxide or the like.

In this embodiment, through the formation of the first conductive region 20 independent of the semiconductor substrate 10, defects or a low open voltage that may occur when a doped region is formed inside the semiconductor substrate 10 may be reduced. Therefore, an open voltage of the solar cell 100 can be increased.

The second conductive region 30 having the second conductivity type may be located on the front surface of the semiconductor substrate 10. As an example, in this embodiment, the second conductive region 30 may be formed by a doped region formed by doping a second-conductivity-type dopant on part of the semiconductor substrate 10. Then, the base region 10 and the second conductive region 30 may include a same crystalline structure and semiconductor material as the semiconductor substrate 10, while conductivity types may be different from each other, or doping concentration may be different from each other. For example, conductivity types of the base region 10 and the second conductive region are different from each other when the base region 10 has the first conductivity type, and the doping concentration of the second conductive region 30 is higher than that of the base region 10 when the base region 10 has the second conductivity type.

When the base region 10 has the first conductivity type, the first conductive region 20 having the first conductivity type constitutes a BSF region that forms a BSF with higher doping concentration than the semiconductor substrate 10 while having a same conductivity type as the semiconductor substrate 10, and the second conductive region 30 having the second conductivity type constitutes an emission region having a different conductivity type from the base region 10 and forming a pn junction with the base region 10. Then, the second conductive region 30 constituting the emission region is located on the front surface of the semiconductor substrate 10, thereby minimizing a path of light bonded to the pn junction.

As a p-type dopant used as the first- or second-conductivity-type dopant, Group III elements such as boron (B), aluminum (Al), gallium (Ga), and indium (In) may be listed, and as an n-type dopant, Group V elements such as phosphorus (P), arsenic (As), bismuth (Bi), and antimony (Sb) may be listed. However, the present disclosure is not limited thereto, and a variety of dopants may be used as the first- or second-conductivity-type dopant.

Except for an opening portion corresponding to the second electrode 44, an insulating film may be integrally formed on the first conductive region 20. Such an insulating film may be composed solely of a non-doped insulating film that does not include a dopant.

For example, a first insulating film may be integrally formed (contact as an example) in a portion other than the opening portion on the first conductive region 20. It is exemplified that the first passivation film 24 formed (contact as an example) on the first conductive region 20 is used as the first insulating film. However, the present disclosure is not limited thereto, and the insulating film may have various arrangements according to a desired function.

The passivation film 24 contacts and is formed in the conductive region 20 so as to passivate defects existing in the surface or main body of the conductive region 20. Therefore, recombination sites of the minority carriers can be removed to increase the open voltage Voc of the solar cell 100.

The passivation film 24 may have a single film selected from a group consisting of a silicon nitride film, a hydrogen-containing silicon nitride film, a silicon oxide film, a silicon oxynitride film, an aluminum oxide film, $mgF_2$, $ZnS$, $TiO_2$, and $CeO_2$, or a multilayer film structure combining more than two of the films. As an example, the passivation film 24 may include a silicon oxide film, a silicon nitride film, or the like having a fixed positive charge when the conductive region 20 has an n type, and may include an aluminum oxide film or the like having a fixed negative charge when having a p type.

A junction layer (tunneling junction layer) 110a is located on a front surface of the second photoelectric conversion part 130 to connect the second photoelectric conversion part 130 with the first photoelectric conversion part 110 located thereon. Although it is shown in the drawing that the junction layer 110a is in contact with the first conductive region 30 and the first photoelectric conversion part 110 respectively, the present disclosure is not limited thereto. The junction layer 110a may have a thin thickness so that the carriers can tunnel smoothly.

The junction layer 110a may electrically connect the first photoelectric conversion part 110 with the second photoelectric conversion part 130, and may include a material that can transmit light (long-wavelength light as an example) used in the first photoelectric conversion part 110. As an example, the junction layer 110a may include at least one of a transparent conductive material (transparent conductive oxide as an example), a conductive carbon material, a conductive polymer, and n-type or p-type amorphous silicon. In some other embodiments, the junction layer 110a may be formed into a structure in which silicon layers having different refractive indexes from each other are alternately stacked, whereby light used in the second photoelectric conversion part 130 (short-wavelength light as an example) can be reflected by the second photoelectric conversion part 130 and light used in the first photoelectric conversion part 110 (long-wavelength light as an example) may be transmitted and supplied to the first photoelectric conversion part 110. However, the present disclosure is not limited thereto, and a variety of materials are applicable as a material, a structure, and the like of the junction layer 110a.

The first photoelectric conversion part 110 including the photoelectric conversion layer 112 including the perovskite compound may be positioned on the junction layer 110a. For example, the first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

The second transport layer 116 located on the junction layer 110a is a layer that extracts and transports second carriers (holes as an example) according to a bandgap relationship with the photoelectric conversion layer 112. As an example, the second carriers transported through the second transport layer 116 may pass through the junction layer 110a and move to the first photoelectric conversion part 110. The second transport layer 116 may include a variety of materials that can perform this function. For example, the second transport layer 116 may include a spirobifluorene compound (such as 2,2',7,7'-tetrakis(N,N-di-p-methoxyphenylamine)-9,9'-spirobifluorene (spiro-OMeTAD)), PTAA, or a metal compound (such as molybdenum oxide). However, the present disclosure is not limited thereto, and a variety of materials may be used as the second transport layer 116.

The photoelectric conversion layer 112 located on the second transport layer 116 may be formed by a perovskite compound having a perovskite structure, and may be a photoactive layer that can be excited by light to form carriers (electrons and holes). As an example, the perovskite structure may have a chemical formula of $AMX_3$ (herein, A is a monovalent organic ammonium cation or metal cation; M is a divalent metal cation; X means a halogen anion). This photoelectric conversion layer 112 serves as $AMX_3$, which may include $CH_3NH_3PbI_3$, $CH_3NH_3PbI_xCl_{(3-x)}$, $CH_3NH_3PbI_xBr_{(3-x)}$, $CH_3NH_3PbCl_xBr_{(3-x)}$, $HC(NH_2)_2PbI_3$, $HC(NH_2)_2PbI_xCl_{(3-x)}$, $HC(NH_2)_2PbI_xBr_{(3-x)}$, $HC(NH_2)_2PbCl_xBr_{(3-x)}$, and the like, or may include a compound in which A of $AMX_3$ is partially doped with Cs. However, the present disclosure is not limited thereto, and a variety of materials may be used as the photoelectric conversion layer 112.

The photoelectric conversion layer 112 composed of a perovskite compound having a perovskite structure may have a predetermined thickness d1, and may have a greater thickness than the first conductive region.

As an example, the predetermined thickness d1 of the photoelectric conversion layer 112 may be 200 nm to 1 μm or more, but is not limited thereto.

However, when the photoelectric conversion layer 112 is formed to have a thickness greater than the predetermined thickness d1, photoelectric efficiency can be improved, and the photoelectric conversion layer 112, when transferred in the stacking direction, may be formed to have a perovskite structure from a region in contact with the second transport layer 116 to a region in contact with the first transport layer 114 while the composition of the perovskite compound is maintained in the stacking direction.

Therefore, in a boundary region serving as the region in contact with the first transport layer 114 or the region in contact with the second transport layer 116, a basic material layer for forming the perovskite compound does not remain. Therefore, the problem of carrier blocking caused by the residue of the basic material layer is eliminated, so that a thick film can be formed while the photoelectric efficiency is ensured.

The first transport layer 114 located on the photoelectric conversion layer 112 is a layer that extracts and transports first carriers (electrons as an example) through a bandgap relationship with the photoelectric conversion layer 112. The first transport layer 114 may include a variety of materials that can perform this function. For example, the first transport layer 114 may include fullerene (C60) or derivatives thereof (such as phenyl-C61-butyric acid methyl ester (PCBM)). However, the present disclosure is not limited thereto, and a variety of materials may be used as the first transport layer 114.

The first electrode 42 may be located on the first photoelectric conversion part 110 (the first transport layer 114 on the front surface thereof as an example), and the second electrode 44 may be located on the second photoelectric conversion part 130 (the first conductive region 20 on the back surface thereof as an example). That is, the solar cell 100 according to this embodiment may have a tandem structure in which the second photoelectric conversion part 130 based on a single semiconductor material (silicon as an example) is bonded to the first photoelectric conversion part 110 based on a perovskite compound through the junction layer 110a.

In this embodiment, the first photoelectric conversion part 110 has a larger bandgap than the second photoelectric conversion part 130. That is, the first photoelectric conversion part 110 has a relatively large bandgap to absorb a short wavelength that is a relatively small wavelength and uses the short wavelength to generate photoelectric conversion, and the second photoelectric conversion part 130 has a bandgap lower than that of the first photoelectric conversion part 110 to effectively absorb a long wavelength that is a wavelength larger than that of the light used in the first photoelectric conversion part 110 and uses the long wavelength to generate photoelectric conversion.

In more detail, when light passes through the front surface of the solar cell 100 and is incident, the first photoelectric conversion part 110 absorbs short wavelengths to generate electrons and holes through photoelectric conversion. In this case, the first carriers (electrons as an example) move to the first electrode 42 side and are collected, and the second carriers (holes as an example) pass through the first photoelectric conversion part 110 and the second photoelectric conversion part 130, move to the second electrode 44 side, and are collected. When a long wavelength passing through but not used in the first photoelectric conversion part 110 reaches the second photoelectric conversion part 130, the second photoelectric conversion part 130 absorbs the long wavelength and generates electrons and holes through photoelectric conversion. In this case, the first carriers (electrons as an example) move to the first electrode 42 side through the first photoelectric conversion part 110 and are collected, and the second carriers (holes as an example) move to the second electrode 44 side and are collected.

As described above, in this application example, since light having various wavelengths can be used in the plurality of photoelectric conversion parts 110 and 120, the efficiency of the solar cell 100 can be greatly improved. In particular, in this embodiment, a variety of properties may be improved by including the first photoelectric conversion part 110 based on a perovskite compound and the second photoelectric conversion part 130 having a hetero-junction structure. Since the first photoelectric conversion part 110 and the second photoelectric conversion part 130 above respectively have excellent open voltages, the efficiency of the solar cell 100 with a tandem structure can be greatly improved. A variety of structures are applicable to the second photoelectric conversion part 130, and the second photoelectric conversion part 120 may not be provided, but only the first photoelectric conversion part 110 is provided. A variety of other modifications are possible.

The first electrode 42 may include a first electrode layer 420 and a second electrode layer 422 sequentially stacked on the photoelectric conversion part 110, and the configuration is the same as that in FIG. 1.

Similarly, the second electrode 44 may form an opening on the second photoelectric conversion part 130 and be in contact with the second conductive region 20.

The first electrode 42 and the second electrode 44 above may have various planar shapes. As an example, the shape as shown in FIG. 2 is also possible, but the present disclosure is not limited thereto.

As described above, a bi-facial structure in which light can be incident on the front surface and the back surface of the solar cell 100 in this application example. Accordingly, the amount of light used in the solar cell 100 may be increased, so it is possible to contribute to improvement in efficiency of the solar cell 100. However, the present disclosure is not limited thereto.

As described above, in the first photoelectric conversion part 110 or the solar cell 100 provided with the photoelectric conversion layer 112 including a perovskite compound, the photoelectric conversion layer 112 is formed into a thick film with a thickness greater than the predetermined thickness d1, so that the photoelectric efficiency can be ensured.

In this case, the photoelectric conversion layer 112 is formed by performing heat treatment after successive formation of a film of a first material A and a film of a second material B for forming the perovskite compound constituting the photoelectric conversion layer 112, so as to form a thick film with a desired thickness.

In this case, the film of the second material B formed after the formation of the film of the first material A through the deposition process is formed to have an excessive thickness by spraying, so that a mixture of the first material A and the second material B can be sufficiently formed, and the perovskite compound is formed simultaneously with the formation of the compound according to the diffusion of the second material B and the first material A therearound by subsequent heat treatment.

Therefore, the photoelectric conversion layer 112, when transferred in the stacking direction, may be formed to have a perovskite structure from a region in contact with the second transport layer 116 to a region in contact with the first transport layer 114 while the composition of the perovskite compound is constantly maintained in the stacking direction.

Therefore, in a boundary region serving as the region in contact with the first transport layer 114 or the region in contact with the second transport layer 116, a film of a basic material for forming the perovskite compound does not remain. Therefore, the problem of carrier blocking caused by the residue of the film of the basic material is eliminated, so that a thick film can be formed while the photoelectric efficiency is ensured.

The features, structures, effects, and the like above are included in at least one embodiment of the present disclosure, and are not necessarily limited to only one embodiment. In addition, the features, structures, effects, and the like exemplified in various embodiments can also be implemented by combining or modifying other embodiments by those skilled in the art to which the embodiments belong. Therefore, content related to such combinations and modifications should be construed as being included in the scope of the present disclosure.

REFERENCE SIGNS

100: solar cell
110: first photoelectric conversion part
120, 130: second photoelectric conversion part
110a: junction layer
42: first electrode
44: second electrode

What is claimed is:

1. A method for manufacturing a solar cell, comprising:
forming a first photoelectric conversion part comprising a photoelectric conversion layer, a first transport layer on one side of the photoelectric conversion layer, and a second transport layer on the other side of the photoelectric conversion layer, wherein the photoelectric conversion layer comprises a perovskite compound; and
forming a first electrode, on one side of the first photoelectric conversion part, electrically connected to the first photoelectric conversion part and forming a second electrode, on the other side of the first photoelectric conversion part, electrically connected to the first photoelectric conversion part,
wherein the forming the first photoelectric conversion part comprising:
forming a first film using a first material constituting the perovskite compound;

spraying a second material constituting the perovskite compound on the first film to form a second film;

performing a first heat treatment to diffuse the first film and the second film to form the perovskite compound;

washing the perovskite compound to remove a portion of the second film residual on the perovskite compound; and performing a second heat treatment on the photoelectric conversion layer after the washing step is performed to remove a portion of the second film, wherein the second heat treatment is performed at a same temperature and for a same time length as the first heat treatment.

2. The method for manufacturing a solar cell according to claim 1, wherein the first film is formed by vacuum depositing the first material.

3. The method for manufacturing a solar cell according to claim 2, wherein the forming the second film comprises:

dissolving the second material using a third material as a solvent to prepare a spray solution; and spraying the spray solution onto the first film to form the second film.

4. The method for manufacturing a solar cell according to claim 3, wherein the spraying the spray solution onto the first film to coat the first film is performed for at least more than once.

5. The method for manufacturing a solar cell according to claim 4, wherein the third material is an alcoholic solvent having a viscosity below a predetermined viscosity at a room temperature.

6. The method for manufacturing a solar cell according to claim 5, wherein the third material is comprised in a detergent that removes the second material in the washing step.

7. The method for manufacturing a solar cell according to claim 1, wherein, the forming the second film comprises: forming a droplet mark on a surface of a substrate by spraying, wherein an uneven structure is formed at a boundary of the droplet mark.

8. The method for manufacturing a solar cell according to claim 7, wherein, in the washing step, a height of the uneven structure is reduced at the boundary of the droplet mark.

9. The method for manufacturing a solar cell according to claim 8, wherein a diameter of the droplet mark ranges from 0.1 um to 1000 um.

10. The method for manufacturing a solar cell according to claim 1, wherein the second film is excessively formed such that a sum of a thickness of the second film and a thickness of the first film is greater than a thickness of the photoelectric conversion layer.

11. The method for manufacturing a solar cell according to claim 1, wherein the first film has a thickness 0.3 to 0.8 times of a thickness of the photoelectric conversion layer.

12. The method for manufacturing a solar cell according to claim 1, prior to forming the first photoelectric conversion part, further comprising:

forming a second photoelectric conversion part having a different material or structure from the first photoelectric conversion part, wherein the forming the second photoelectric conversion part comprises:

forming, on a semiconductor substrate, a first conductive region composed of a first semiconductor layer formed separately with respect to the semiconductor substrate and a second conductive region composed of the first semiconductor layer formed separately with respect to the semiconductor substrate.

13. The method for manufacturing a solar cell according to claim 12, further comprising: forming a junction layer on the second photoelectric conversion part, wherein in the formation of the first photoelectric conversion part, the second transport layer is formed on the junction layer, the photoelectric conversion layer is formed on the second transport layer, and the first transport layer is formed on the photoelectric conversion layer.

* * * * *